US006424282B1

(12) United States Patent
Maenza

(10) Patent No.: US 6,424,282 B1
(45) Date of Patent: Jul. 23, 2002

(54) METHOD AND APPARATUS FOR NOISE COMPENSATION IN DIGITAL TO ANALOG CONVERTERS

(75) Inventor: Glenn J. Maenza, Glen Mills, PA (US)

(73) Assignees: Sony Corporation (JP); Sony Music Entertainment, Inc., New York, NY (US)

( * ) Notice: Subject to any disclaimer, the term of this patent is extended or adjusted under 35 U.S.C. 154(b) by 0 days.

(21) Appl. No.: 09/802,837

(22) Filed: Mar. 9, 2001

(51) Int. Cl.[7] .................................................. H03M 1/66
(52) U.S. Cl. ...................................... 341/144; 341/118
(58) Field of Search ................................ 341/144, 118, 341/120

(56) References Cited

U.S. PATENT DOCUMENTS

| | | | |
|---|---|---|---|
| 5,625,360 A | 4/1997 | Garrity et al. | 341/144 |
| 5,638,454 A | 6/1997 | Jones et al. | 381/71 |
| 5,661,439 A | 8/1997 | Watkins et al. | 331/1 R |
| 5,721,547 A | 2/1998 | Longo | 341/118 |
| 5,796,850 A | 8/1998 | Shiono et al. | 381/94.1 |
| 6,084,539 A | 7/2000 | Yamada | 341/155 |
| 6,115,162 A | 9/2000 | Graves et al. | 359/173 |
| 6,151,397 A | 11/2000 | Jackson, Jr. II et al. | 381/71.4 |
| 6,154,547 A | 11/2000 | Whitecar | 381/94.2 |
| 6,236,347 B1 * | 5/2001 | Cheng | 341/145 |

FOREIGN PATENT DOCUMENTS

| | | |
|---|---|---|
| JP | 7336648 | 12/1995 |
| JP | 1022827 | 1/1998 |

OTHER PUBLICATIONS

Stephen St. Croix, "Digitalis Part 1 (Or: I Don't Think This Sounds Quite Right)," Fast Lane, (2 pages).
Stephen St. Croix, "Digitalis, Part 2 (Or, I Know How To Fix It)," Fast Lane, (2 pages).
"Quick Identification Of Periodic Jitter Sources," Application Brief AN 1200–4, Hewlett Packard, (2 pages), Dec., 1990.
"Improving Jitter In Computer Clocks," Application Note 1210–8, pp. 1–5, Hewlett Packard, May, 1991.
"Jitter Spectrum Analysis," Product Note 5372A–1, Hewlett Packard, pp. 1–17, Sep., 1991.
Robert Harley, "A Transport Of Delight", Stereophile.
Robert Harley, "The Jitter Game," Stereophile, pp. 114–145, Jan., 1993.
Rémy Fourré, "Jitter & The Digital Interface," Stereophile, pp. 80–97, Oct., 1993.
Edward A. LeMaster, "Compact Disc Manufacturing, Procedures And Processes," University of Washington, www.washington.edu/conselec/W94/edward/edward.htm, Mar. 5, 1994.
Glenn Zelniker and Roger Taylor, "Jitter Hysteria, Understanding Temporal Uncertainty," pp. 26, 28, 278, 279, 281–283, Nov. 1994.
"Digital Audio Transmission, Why Jitter Is Important," Audio.TST System One & Two Newsletter, pp. 1–16, vol. 11, Jan., 1996.

(List continued on next page.)

Primary Examiner—Peguy Jeanpierre
Assistant Examiner—Joseph J Lauture
(74) Attorney, Agent, or Firm—Lerner, David, Littenberg, Krumholz & Mentlik, LLP

(57) ABSTRACT

An apparatus includes a digital-to-analog converter operable to produce an analog output signal in response to a digital input signal, a final word clock signal CLK signal, and a final voltage reference signal; and a noise compensation circuit operable to receive an initial word clock signal and an initial voltage reference signal and to produce the final word clock signal and the final voltage reference signal such that errors in the analog output signal due to at least one of timing noise on the initial word clock signal and amplitude noise on the initial voltage reference signal are reduced.

93 Claims, 7 Drawing Sheets

OTHER PUBLICATIONS

Bob Katz, "Everything You Always Wanted To Know About Jitter But Were Afraid To Ask," Digital Domain, pp. 1–7, Feb. 22, 1996.

Chris Dunn and Malcolm Omar Hawksford, "Bits Is Bits?," Stereophile, pp. 49, 51, 53, 55, 57, 59, 61, 63, 65, 67, 69, 71, 73, 75–77, 79, 81, Mar., 1996.

Francis Rumsey, "Digital Sound Quality: Preference And Presentation," Studio Sound, pp. 99–101, May, 1996.

Robert Harley, Article, Stereophile, pp. 35, 37, Aug., 1996.

Benjamin Britton, answering "What's A DVD and How Does it Work?," Scientific American: Ask the Experts: Computers, www.sciam.com/askexpert/computers/computers12/index.html, (5 pages), Aug. 30, 1999.

Marshall Brian, "How Compact Discs (CDs) Work," Howstuffworks.com, (6 pages), 1998–2000.

Dave Moyssiadis, "Horns of a CDilemma," News Article, Feb., 1999.

Marshall Brain, "How Analog and Digital Recording Works," Howstuffworks.com, (7 pages), 1998–2000.

Mike Mayer, "How Do Compact Disks Work?", pw1.netcom.com/~mayermh/documents/cd_discussion.html, (20 pages), 2000.

"The Sound of CD–Pt. 2", cd Mastering, (5 pages).

Dan Daley, "Putting Pre–Mastering Back Into The Loop (The Sound of CD—Pt. 3)," cd Pre–Mastering, (5 pages).

Philip De Lancie, "JVC Stakes Out The High Ground," cd Pre–Mastering, (5 pages).

Patrick Stapley, "The Sound of Music CD," cd Pre–Mastering, One to One, (6 pages), Jan. 1997.

Dr. Jonathan Halliday, "Jitter, What It Is, And How To Measure It, " Nimbus Technology & Engineering.

The John Watkinson File, Article, (1 page).

Synchronization in Digital Audio Interfacing, Focal Press, pp. 154–160, 1995.

"Jitter, Bits, & Sound Quality", Article, Stereophile, pp. 179–181, Dec. 1990.

* cited by examiner

METHOD AND APPARATUS FOR NOISE COMPENSATION IN DIGITAL TO ANALOG CONVERTERS

BACKGROUND OF THE INVENTION

The present invention relates to noise compensation methods and apparatuses and, in particular, to methods and apparatuses for performing noise cancellation in digital-to-analog converter applications.

With reference to FIG. 1, a conventional digital-to-analog converter (DAC) 10 produces an analog output signal (analog data) in response to a digital input signal (digital data). For example, the digital input signal may be a series of digital words containing a certain number of bits and the DAC 10 produces an analog output signal having a series of amplitudes corresponding to the digital words. The DAC 10 receives a clock signal CLK (also referred to as a word clock signal) and a voltage reference signal (Vref). The Vref signal is usually a DC level, such as 5 volts, 10 volts, etc.

The DAC 10 utilizes the DC level of the Vref signal in producing a given amplitude of the analog output signal in response to a particular digital word. Mathematically, the digital words may be thought of as fractions of unity (or percentages) that multiply the DC value of the Vref signal to produce the corresponding amplitudes of the analog output signal. For example, assuming that the digital input signal is composed of three bit digital words, the digital word 000 may represent a minimum digital magnitude and the digital word 111 may represent a digital maximum magnitude. The DAC 10 treats each digital word as a multiplier that modifies the Vref signal to produce the analog output signal. Thus, for example, the digital word 000 may be treated as a multiplier having a value of 0, the digital word 001 may be treated as a multiplier having a value of 0.125, the digital word 010 may be treated as a multiplier having a value of 0.250, etc. Thus, assuming that the Vref signal is 10 volts, the amplitude of the analog output signal in response to the digital word 010 in this example would be 0.250×10=2.5 volts.

The word clock signal CLK is utilized by the DAC 10 to establish the particular instances in time that the amplitude of the analog output signal should change in response to new digital words. Conventional DACs produce new amplitudes of the analog output signal on one of the rising and falling edges of the word clock signal CLK.

With reference to FIGS. 2A and 2B, the conventional DAC 10 exhibits undesirable performance when noise appears on the word clock signal CLK. FIG. 2A illustrates the ideal falling edges of the word clock signal CLK, which for the purposes of this discussion are utilized by the DAC 10 to indicate when the amplitude of the analog output signal should be transitioned. The ideal falling edges of the word clock signal CLK occur at t1, t2, t3, etc. In a practical circuit, however, the falling edges of the word clock signal CLK may occur at different instances due to noise. As the noise on the word clock signal CLK affects the timing of the falling edges, it is referred to herein as timing noise, but is also referred to in the art as jitter. By way of example, jitter on the word clock signal CLK may cause falling edges to occur at t1−Δt, t2−Δt, etc. As will be discussed hereinbelow, the jitter may be time invariant (e.g., producing a fixed Δt) or may be time variant (e.g., producing a Δt that changes with time).

Reference is now made to FIG. 2B which illustrates an affect that jitter on the word clock signal CLK may have on the analog output signal from the DAC 10. The solid line of FIG. 2B is intended to illustrate an ideal analog output signal from the DAC 10 in response to different digital words of the digital input signal. For simplicity, the ideal analog output signal is illustrated as a series of piecewise linear segments, although it is understood that a practical DAC produces a stepped response. Conceptually, the piecewise linear segments shown in FIG. 2B may be thought of as time integrals of the stepped output from the DAC 10 as may be produced by a filter.

Transitions in the analog output signal ideally occur at times t1, t2, t3, etc. Continuing with the example above and assuming that the digital word input to the DAC 10 was 011 just prior to time t1, the ideal analog output signal would be 3.75 volts at t1. Assuming that the digital word input to the DAC 10 just prior to time t2 was 111, the analog output signal would ideally be 10 volts at time t2. Similarly, if the digital word input to be DAC 10 just prior to time t3 was 011, then the analog output signal would ideally be 3.75 volts at time t3.

Assuming some jitter on the word clock signal CLK, however, the transitions of the analog output signal from the DAC 10 might not occur at the ideal times of t1, t2, t3, etc. Indeed, assuming a time invariant jitter of Δt, the transitions of the analog output signal would occur at the wrong times, e.g., t1−Δt, t2−Δt, t3−Δt, etc. In keeping with the above example, the amplitude of the analog output signal would be: (i) 3.75 volts at t1−Δt, (ii) 10.00 volts at time t2−Δt, and (iii) 3.75 volts at time t3−Δt. The piecewise linear approximation of the analog output signal as affected by jitter is shown in FIG. 2B by way of dashed line and labeled non-ideal analog output signal (jitter). Comparisons of the ideal analog output signal and the non-ideal analog signal due to jitter on the word clock signal CLK reveal that producing the right amplitudes at the wrong times is the same as producing the wrong amplitudes at the ideal times of t1, t2, t3, etc. Consequently, jitter on the word clock signal CLK produces errors in the amplitude of the analog output signal.

With reference to FIG. 2C, the Vref signal may include amplitude noise. By way of example, the amplitude noise illustrated in FIG. 2C is time invariant after time t1, although it is understood that the amplitude noise on the Vref signal may also be time variant (as will be discussed hereinbelow). Referring again to FIG. 2B, amplitude noise on the Vref signal will produce errors in the analog output signal from the DAC 10. In keeping with the digital words of 011, 111, and 011 in the above example, time invariant amplitude noise on the Vref signal (assuming no jitter on the word clock signal CLK) would produce an analog output signal from the DAC 10 having amplitudes at the ideal times of t1, t2, t3, etc. that are offset from the ideal amplitudes of 3.75 volts, 10.00 volts, 3.75 volts, respectively. In particular, the amplitude noise on the Vref signal illustrated in FIG. 2C, may be of sufficient magnitude to cause the amplitudes of the analog output signal of the DAC 10 to be 5.00 volts, 11.25 volts, and 5.00 volts at respective times t1, t2, t3, etc. These non-ideal amplitudes of the analog output signal are shown in FIG. 2B in dashed line and labeled non-ideal analog output signal (amp. noise). A comparison of the ideal analog output signal to the non-ideal output signal due to amplitude noise on the Vref signal reveals that the amplitude noise on the Vref signal produces amplitude errors in the analog output signal.

As discussed above, the jitter on the word clock signal CLK and/or the amplitude noise on the Vref signal may be time variant. Indeed, the jitter and/or the amplitude noise may contain energy at a single frequency (e.g., pure sinusoidal noise) or may contain energy at a number of discreet frequencies or even many discreet frequencies (e.g., white noise).

With reference to FIGS. 3A–3F, illustrative examples of the affects that time variant amplitude noise on the Vref signal and time variant jitter on the word clock signal CLK have on the analog output signal of the DAC 10 will now be discussed. With reference to FIG. 3A, an ideal analog output signal from the DAC 10 in response to a digital input signal consistent with a pure sine wave having a frequency of about 20 KHz is illustrated. The ideal analog output signal shown in FIG. 3A would be produced by the DAC 10 (assuming proper filtering of the stepped output) if the transitions of the word clock signal CLK occurred at ideal times (e.g., no jitter was present) and no amplitude noise was present on the Vref signal. With reference to FIG. 3B, the frequency spectrum of the ideal analog output signal from the DAC 10 (FIG. 3A) is illustrated. In particular, the frequency spectrum of the ideal analog output signal is a single magnitude of energy at 20 KHz. This magnitude is proportional to the amplitude of the ideal analog output signal.

With reference to FIG. 3C, the amplitude noise on the Vref signal may be time variant, such as amplitude noise containing energy at a single frequency of 1 KHz. Where the ideal Vref signal is flat as a function of time, the non-ideal Vref signal having amplitude noise at 1 KHz varies with time in accordance with sinusoidal properties. Assuming that the DAC 10 would produce the ideal analog output signal shown in FIG. 3A with no jitter and no amplitude noise on the Vref signal, the frequency spectrum of a non-ideal analog output signal due to amplitude noise on the Vref signal at 1 KHz would exhibit sidebands at 19 KHz and 21 KHz as shown in FIG. 3D. The magnitudes of these sidebands would be proportional to the amplitude of the amplitude noise on the Vref signal.

FIG. 3E shows a word clock signal CLK at a frequency of about 50 KHz that includes time variant jitter, where the jitter includes energy at a single frequency of 1 KHz. The dashed lines of FIG. 3E are intended to illustrate that the rising and/or falling edges of the word clock signal CLK may occur within certain time intervals, where the width of the time intervals is proportional to the "amplitude" of the time variant jitter. Those skilled in the art will appreciate that the amplitude of the jitter may be measured using, for example, a time interval analyzer which produces an RMS value (i.e., an amplitude) representing the width of the time interval defined by the jitter. When the 1 KHz jitter shown in FIG. 3E is present on the word clock signal CLK, sidebands also appear in the frequency spectrum of the analog output signal at at least 19 KHz and 21 KHz as shown in FIG. 3D. The magnitudes of these sidebands are proportional to the amplitude of the jitter on the word clock signal CLK. Those skilled in the art will appreciate that if the jitter contains energy at more frequencies, additional sidebands will appear in the frequency spectrum of the analog output signal from the DAC 10.

Time variant jitter on the word clock signal CLK produces an additional disadvantageous affect on the frequency spectrum of the analog output signal from the DAC 10. Indeed, the magnitudes of the sidebands produced by the jitter varies as a function of the frequency content of the digital input signal of the DAC 10. For example, as shown in FIG. 3F, assuming that the word clock CLK includes sinusoidal jitter at 1 KHz, the magnitude of resultant sidebands will increase as the frequency of the digital input signal increases. Indeed, the magnitude of the sidebands increases linearly with the frequency of the digital input signal (e.g., at about 6 db per octave). Consequently, the undesirable affects of these sidebands are exacerbated at higher frequencies of the digital input signal.

The non-ideal characteristics of the analog output signal from the DAC 10 may surface in any number of situations, for example, when the DAC 10 is utilized in a CD player, a DVD player, etc. The amplitude noise on the Vref signal and/or the timing noise (jitter) on the word clock signal CLK may originate from the recording disc and/or from various noise sources within the players. With respect to the recording medium, sources of jitter and/or amplitude noise may include, but are not limited to (i) master recording medium errors (e.g., ill-defined, displaced and/or inaccurate pits and lands) that are replicated or exacerbated when the master recording medium is replicated into intermediate and/or final recording media; (ii) replication recording medium errors (e.g., warpage of intermediate and/or final replication recording media, ill-defined, displaced or inaccurate lands and pits, non-uniform replication recording media thickness or any variation in the replication recording medium itself or the process for producing the same); (iii) errors in encoding digital data onto the master recording medium (e.g., eight-to-fourteen modulation (EFM) timing errors, bandwidth errors, etc.); (iv) errors in decoding digital data from the replication recording medium (e.g., timing errors in converting the EFM data into 8 bit data, bandwidth errors, etc.); (v) circuit interface errors (e.g., analog-to-digital conversions, digital-to-analog conversions, impedance matching errors, bandwidth limitations, etc.); and (vi) circuit errors (e.g., power supply noise, switching noise, bandwidth limitations, etc.).

Although industry specifications for CDs and CD players, such as the Red Book, establish tolerances for at least some of the above-listed errors, it has been recognized that these tolerances may permit unacceptable levels of jitter and/or amplitude noise, thereby resulting in user dissatisfaction, reduced revenue, etc.

Conventional methods for reducing the errors in the analog output signal from the DAC 10 in response to jitter on the word clock signal CLK involve the use of a phase-locked loop (PLL), a shift register, and a crystal clock. The PLL is used to clock the digital input signal into the shift register and the crystal clock is used to clock the digital input signal out of the shift register. When the word clock signal CLK for the DAC 10 is derived from the crystal clock, the effects of the jitter which might otherwise be on the word clock signal CLK are theoretically reduced. It has been discovered, however, that such jitter is not completely eliminated and, in fact, such jitter may capacitively couple to the word clock signal CLK of the DAC 10 even when the word clock signal CLK is derived from the crystal clock. Moreover, other sources of jitter on the word clock signal CLK (such as capacitively coupled switching power supply noise, etc.) are not compensated for when the PLL, shift register and crystal clock method is employed.

Accordingly, there is a need in the art for new methods and/or apparatuses for compensating for jitter and/or amplitude noise in digital-to-analog applications.

SUMMARY OF THE INVENTION

In accordance with at least one aspect of the present invention, an apparatus may include: a digital-to-analog converter operable to produce an analog output signal in response to a digital input signal, a final word clock signal CLK signal, and a final voltage reference signal; and a noise compensation circuit operable to receive an initial word clock signal CLK signal and an initial voltage reference signal and to produce the final word clock signal and the final voltage reference signal such that errors in the analog output signal due to at least one of timing noise on the initial word clock signal CLK signal and amplitude noise on the initial voltage reference signal are reduced.

In accordance with at least one further aspect of the present invention, the noise compensation circuit may include: at least one of a first noise compensation circuit and a second noise compensation circuit. The first noise compensation circuit may be operable to receive the initial word clock signal CLK signal including timing information and timing noise, and to at least partly cancel the timing noise from the initial word clock signal CLK signal to produce the final word clock signal CLK signal. The second noise compensation circuit may be operable to receive the initial voltage reference signal including amplitude information and amplitude noise, and to at least partly cancel the amplitude noise from the initial voltage reference signal to produce the final voltage reference signal.

In accordance with at least one still further aspect of the present invention, the noise compensation circuit may be further operable to at least one of (i) produce the final word clock signal CLK signal by modifying the initial word clock signal CLK signal as a function of the amplitude noise such that errors in the analog output signal due to the amplitude noise are reduced, and (ii) produce the final voltage reference signal by modifying the initial voltage reference signal as a function of the timing noise such that errors in the analog output signal due to the timing noise are reduced.

In accordance with at least one still further aspect of the present invention, a method of reducing errors in an analog output signal of a digital-to-analog converter may include: receiving an initial word clock signal CLK signal having timing information and timing noise; receiving an initial voltage reference signal having amplitude information and amplitude noise; and modifying at least one of the initial voltage reference signal and the initial word clock signal CLK signal to produce a final voltage reference signal and a final word clock signal CLK signal, the final voltage reference signal and the final word clock signal CLK signal being usable by the digital-to-analog converter such that errors in the analog output signal due to at least one of amplitude noise on the initial voltage reference signal and timing noise on the initial word clock signal CLK signal are reduced.

In accordance with at least one still further aspect of the present invention, the method may include at least one of at least partly canceling the timing noise from the initial word clock signal to produce the final word clock signal, and at least partly canceling the amplitude noise from the initial voltage reference signal to produce the final voltage reference signal.

In accordance with at least one still further aspect of the present invention, the method may include at least one of modifying the initial word clock signal as a function of the amplitude noise such that errors in the analog output signal due to the amplitude noise are reduced, and modifying the initial voltage reference signal as a function of the timing noise such that errors in the analog output signal due to the timing noise are reduced.

Other features and advantages of the present invention will become apparent from the following description of the invention, which refers to the accompanying drawings.

BRIEF DESCRIPTION OF THE DRAWINGS

For the purposes of illustrating the invention, there are shown in the drawings forms which are presently preferred, it being understood, however, that the invention is not limited to the precise arrangements and/or instrumentalities shown.

DETAILED DESCRIPTION OF THE INVENTION

Figure 1:
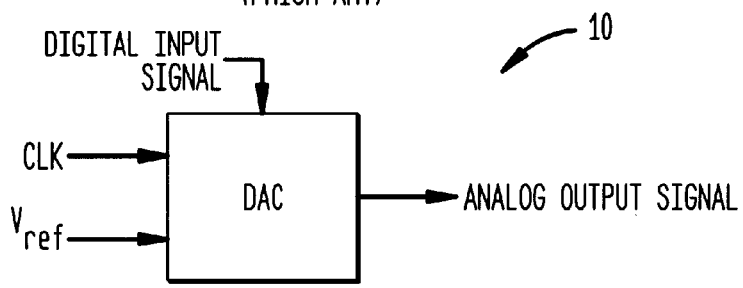
FIG. 1 is a block diagram illustrating a conventional digital-to-analog converter (DAC) of the prior art.
Figure 2A:
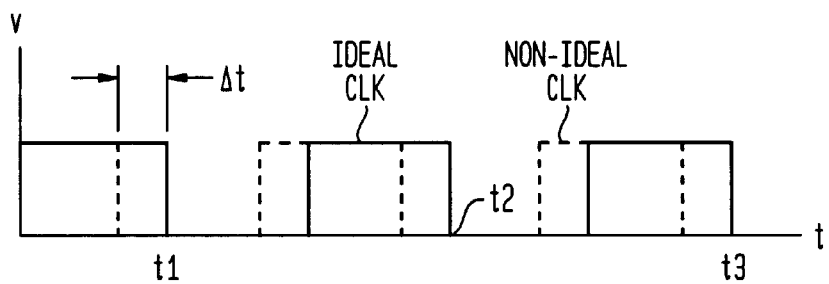
FIG. 2A is a graph illustrating an ideal and a non-ideal word clock signal CLK signal that may be input to the DAC of FIG. 1.
Figure 2B:
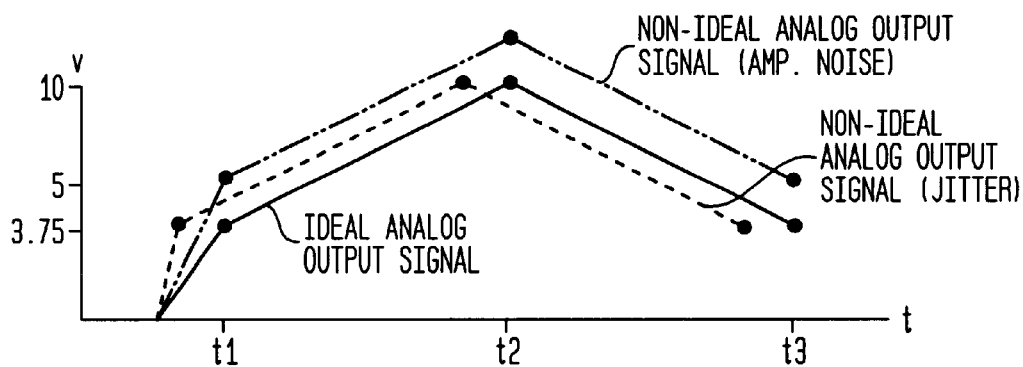
FIG. 2B is a graph illustrating an ideal analog output signal and non-ideal analog output signals that may be produced by the DAC of FIG. 1.
Figure 2C:
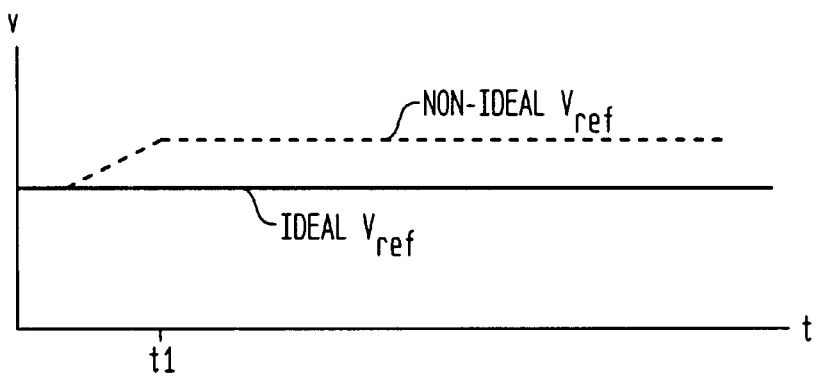
FIG. 2C is a graph illustrating an ideal voltage reference signal and a non-ideal voltage reference signal that may be input to the DAC of FIG. 1.
Figure 4:
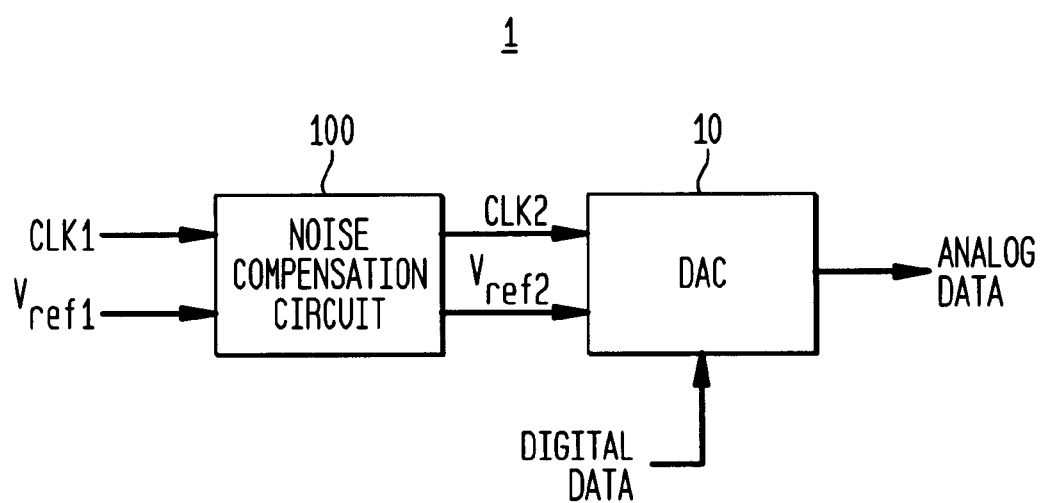
FIG. 4 is a block diagram illustrating an apparatus for compensating for non-ideal characteristics of a word clock signal and/or a voltage reference signal in a digital-to-analog conversion application in accordance with at least one aspect of the present invention.

Referring now to the drawings when like numerals indicate like elements, there is shown in FIG. 4 a block diagram of an apparatus 1 for reducing errors in an analog output signal of a digital-to-analog converter. The apparatus 1 preferably includes a noise compensation circuit 100 connectable to a DAC 10. The DAC 10 is operable to produce an analog output signal in response to a digital input signal, a final (or second) word clock signal CLK2, and a final (or second) voltage reference signal Vref2. By way of example, the DAC 10 may be implemented utilizing the DAC 10 of FIG. 1 discussed hereinabove, although any of the known DACs in the art may be utilized without departing from the scope of the invention.

The noise compensation circuit 100 is preferably operable to receive an initial (or first) word clock signal CLK1 and an initial (or first) voltage reference signal Vref1 and to produce the final word clock signal CLK2 and the final voltage reference signal Vref2 such that errors in the analog output signal due to at least one of timing noise on the initial word clock signal CLK1 and amplitude noise on the initial voltage reference signal Vref1 are reduced.

It is most preferred that the DAC 10 and noise compensation circuit 100 are implemented on a common semiconductor die, such as in an integrated circuit chip.

Figure 5:
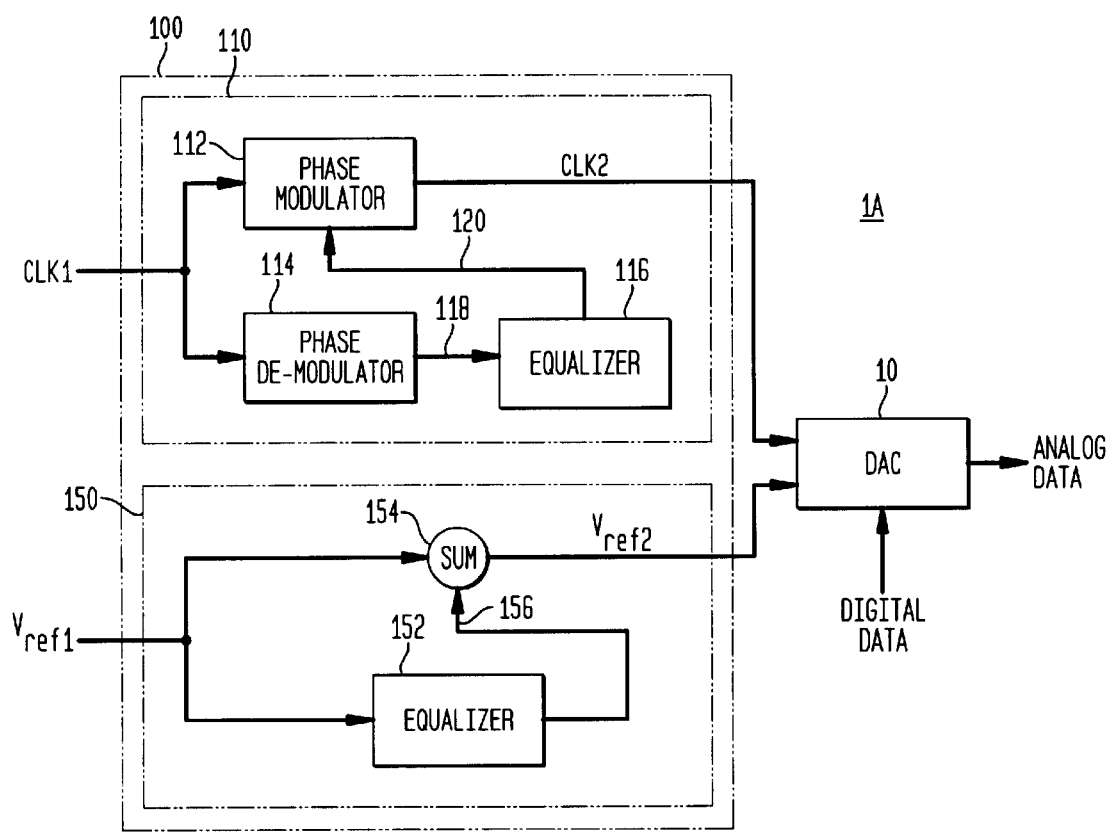
FIG. 5 is a more detailed block diagram of a noise compensation circuit suitable for use in accordance with at least one aspect of the present invention.

At least one further aspect of the present invention will now be described with reference to FIG. 5, which is a block diagram of an apparatus 1A suitable for reducing errors in the analog output signal of the DAC 10. FIG. 5 shows a more detailed block diagram illustrating one or more embodiments of the noise compensation circuit 100 of the present invention. In particular, the noise compensation circuit 100 may include at least one of a first noise compensation circuit 110 and a second noise compensation circuit 150, it being understood that either or both of the noise compensation circuits 110, 150 may be employed without departing from the scope of the invention.

Preferably, the first noise compensation circuit 110 is operable to receive the initial word clock signal CLK1 including timing information and timing noise, and to at least partially cancel the timing noise from the initial word clock CLK1 to produce the final word clock signal CLK2. The first noise compensation circuit 110 preferably includes a phase modulator (circuit) 112, a phase demodulator (circuit) 114, and an equalizer (circuit) 116. The phase modulator 112 is preferably operable to receive the initial word clock signal CLK1 and vary the phase thereof in accordance with a modulating signal 120 to produce the final word clock signal CLK2. The phase demodulator 114 is preferably operable to receive the initial word clock signal CLK1 and to produce a demodulated signal 118 having an amplitude that is proportional to the amplitude of the timing noise on the initial word clock signal CLK1. The equalizer 116 is preferably operable to produce the modulating signal 120 from the demodulated signal 118.

In accordance with at least one aspect of the invention, a transfer function of the equalizer 116 is preferably designed such that the phase shift imposed by the phase modulator 112 on the initial word clock signal CLK1 opposes the timing noise (i.e., the jitter) on the initial word clock signal CLK1. Designing this transfer function may be achieved utilizing any of the known system control techniques in the art without departing from the scope of the invention. For example, the transfer function of the equalizer 116 may be designed by establishing a desired relationship between the transfer functions of the phase modulator 112, the phase demodulator 114 and the equalizer 116. This relationship may be obtained as follows. An overall transfer function of the first noise compensation circuit 110 from the initial word clock signal CLK1 to the final word clock signal CLK2 as a function of frequency (e.g., the frequency of the jitter) may be expressed as follows:

$$CLK2(s)/CLK1(s)=1+h_{PDM}(s) \cdot h_{EQ}(s),$$

where the transfer function of the phase modulator 112, $h_{PM}(s)$, is ideally a summing function with respect to the jitter on the initial word clock signal CLK1; $h_{PDM}(s)$ is the transfer function of the phase demodulator 114; and $h_{EQ}(s)$ is the transfer function of the equalizer 116. Solving for $h_{EQ}(s)$ (i.e., the transfer function of the equalizer 116), and setting the overall transfer function CLK2(s)/CLK1(s) equal to zero, yields:

$$h_{EQ}(s)=1/h_{PDM}(s).$$

Additional details concerning the above equations will now be discussed. The transfer function of the phase modulator 112, $h_{PM}(s)$, may include the ideal summing function discussed above as well as a first amplitude response and a first phase response from the initial word clock signal CLK1(s) to the final word clock signal CLK2(s). The transfer functions $h_{PM}(s)$ may also include a second amplitude response and a second phase response from the modulating signal 120 to the final word clock signal CLK2(s).

Assuming that the transfer function of the phase modulator 112, $h_{PM}(s)$, is not an ideal summing function, the overall transfer function of the first noise compensation circuit 110 from the initial word clock signal CLK1 to the final word clock signal CLK2 as a function of frequency (e.g., the frequency of the jitter) may be expressed as follows:

$$CLK2(s)/CLK1(s)=h_{PM1}(s)+h_{PDM}(s) \cdot h_{EQ}(s) \cdot h_{PM2}(s),$$

where $h_{PM1}(s)$ includes the first amplitude and first phase responses of the transfer function of the phase modulator 112 from the initial word clock signal CLK1 to the final word clock signal CLK2; and $h_{PM2}(s)$ includes the second amplitude and second phase responses of the transfer function of the phase modulator 112 from the modulating signal 120 to the final word clock signal CLK2. Solving for the transfer function of the equalizer 116 and setting the overall transfer function CLK2(s)/CLK1(s) equal to zero, yields:

$$h_{EQ}(s)=h_{PM1}(s)/(h_{PM2}(s) \cdot h_{PDM}(s)).$$

The transfer function of the phase demodulator circuit 114, $h_{PDM}(s)$, from the initial word clock signal CLK1 to the demodulated signal 118 (as a function of frequency) includes an amplitude response and a phase response. The amplitude response is proportional to magnitudes of the demodulated signal 118 in response to magnitudes of the timing noise (as functions of frequency). The phase response is proportional to phase changes of the demodulated signal 118 in response to the timing noise (as functions of frequency).

Similarly, the transfer function of the equalizer 116, $h_{EQ}(s)$, from the demodulated signal 118 to the modulating signal 120 as function of frequency includes an amplitude response and a phase response.

As the above equation for the transfer function of the equalizer 116, $h_{EQ}(s)$, suggests, advantageous results are obtained when the amplitude response of the equalizer 116 is inversely proportional to the amplitude response of the phase demodulator 114. The constant of proportionality is preferably unity, although any constant of proportionality may be utilized without departing from the scope of the invention. Those skilled in the art will appreciate that the inverse relationship between the amplitude response of the equalizer 116 and the amplitude response of the phase demodulator 114 need not be absolute. Indeed, the relationship may be approximated and/or the relationship need only hold over at least some range of frequencies, such as a range that encompasses the likely energy content of the jitter on the initial work clock signal CLK1.

Designing the transfer function of the equalizer 116, $h_{EQ}(s)$, such that the amplitude response thereof is inversely proportional to the amplitude response of the phase demodulator 114 ensures that substantial cancellation of the jitter on the initial word clock signal CLK1 is obtained. Indeed, assuming that the phase response of the equalizer 116 is properly designed, such substantial cancellation of the jitter on the initial word clock signal CLK1 will be enjoyed. Preferably, the phase response of the equalizer 116 is about 180° shifted from the phase response of the phase demodulator 114. It is believed that this will ensure that the modulating signal 120 will cause the phase modulator 112 to adjust the phase of the word clock signal CLK1 in such a way as to substantially cancel the jitter on that signal.

Assuming that the transfer function of the phase modulator 112 is not an ideal summing function with respect to the jitter on the initial word clock signal CLK1 (i.e., one or all of the first and second amplitude responses and the first and second phase responses of the phase modulator 112 are non-ideal and are taken into account), the amplitude response of the equalizer 116 is preferably (i) inversely proportional to a product of the amplitude response of the phase demodulator 114 and the second amplitude response of the phase modulator 112; and (ii) proportional to the first amplitude response of the phase modulator 112. In this case, the phase response of the equalizer 116 is preferably about 180° shifted from a difference of (i) the first phase response of the phase modulator 112; and (ii) a sum of the phase response of the phase demodulator 114 and the second phase response of the phase modulator 112.

Determining the transfer functions (e.g., the amplitude and/or phase responses) of the phase modulator 112, the phase demodulator 114, the equalizer 116, (or any other circuit block of the invention) may be achieved using any of the known techniques. While the invention is not limited to any particular theory of operation, it is believed that these transfer functions may be determined using the theory of supposition, e.g., that the response of a circuit block to a complex signal (e.g., the jitter on the initial word clock signal CLK1 and/or the amplitude noise on the initial voltage reference signal Vref1) may be broken down into individual responses at discreet frequencies and then summed to obtain the overall response. Thus, techniques for determining amplitude and/or phase responses may include the use of manual and/or computerized modeling techniques, empirical measurements utilizing dynamic network analysis, such as by employing time interval analyzers, frequency spectrum analyzers, noise generators, swept frequency generators, impulse generators, etc.

The second noise compensation circuit 150 is preferably operable to receive the initial voltage reference signal Vref1 including amplitude information and amplitude noise, and to at least partially cancel the amplitude noise from the initial voltage reference signal Vref1 to produce the final voltage reference signal Vref2. In particular, the second noise compensation circuit 150 includes a combining circuit operable to aggregate the initial voltage reference signal Vref1 and an amplitude noise compensation signal 156 to produce the final voltage reference signal Vref2. Preferably, the combining circuit includes a summing circuit 154 operable to either add the initial reference voltage signal Vref1 and the amplitude noise compensation signal 156, or subtract the amplitude noise compensation signal 156 from the initial voltage reference signal Vref1, to produce the final voltage reference signal Vref2.

Preferably, the second noise compensation circuit 150 further includes an equalizer 152 operable to produce the amplitude noise compensation signal 156 from the initial voltage reference signal Vref1. In accordance with at least one aspect of the present invention, a transfer function of the equalizer 152 is preferably designed such that the sum (or difference) produced by the summing circuit 154 opposes any amplitude noise on the initial voltage reference signal Vref1. As was the case with the first noise compensation circuit 110, designing the transfer function of the equalizer 152 may be achieved using any of the known system control techniques. For example, the transfer function of the equalizer 152 may be designed by establishing a desired relationship between the transfer functions of the summing circuit 154 and the equalizer 152. This relationship may be obtained as follows. An overall transfer function of the second noise compensation circuit 150 from the initial voltage reference signal Vref1 to the final voltage reference signal Vref2 as a function of frequency (e.g., the frequency of the amplitude noise) may be expressed as follows:

$$V_{ref}2(s)/V_{ref}1(s)=1+h_{EQ}(s),$$

where the transfer function of the summing circuit 154, $h_{SUM}(s)$, is assumed ideal, and $h_{EQ}(s)$ is the transfer function of the equalizer 152.

It is believed that advantageous results are obtained when the overall transfer function of the second noise compensation circuit 150 is substantially zero over at least some range of frequencies (e.g., a range that encompasses the likely energy content of the amplitude noise on the initial voltage reference signal Vref1). Thus, the above relationship yields:

$$0=1+h_{EQ}(s)h_{EQ}(s)=1.$$

Additional details concerning the above equations will now be discussed. The transfer function of the summing circuit 154, $h_{SUM}(s)$ from the initial voltage reference signal Vref1 to the final voltage reference signal Vref2 may include an amplitude response and a phase response as functions of frequency. Similarly, the transfer function of the equalizer 152, $h_{EQ}(s)$, includes an amplitude response and a phase response as functions of frequency.

As the above equation for the transfer function of the equalizer 152, $h_{EQ}(s)$, suggests, it is believed that advantageous results are obtained when the amplitude response of the equalizer 152 is substantially a constant (e.g., unity) over at least some range of frequencies. Indeed, it is believed that when the amplitude response of the equalizer 152 is so designed, substantial cancellation of the amplitude noise on the initial voltage reference signal Vref1 is obtained. It is preferred that the amplitude response of the equalizer 152 is approximately zero at zero frequency so that the amplitude information of the initial voltage reference signal Vref1 is neither duplicated nor lost due to the summing action of the summing circuit 154. In order to achieve the desired cancellation, the phase response of the equalizer 152 is preferably about 180° when the summing circuit 154 is operable to add the initial voltage reference signal Vref1 and the amplitude noise compensation signal 156 to produce the final voltage reference signal Vref2. Alternatively, the phase response of the equalizer 152 is preferably about 0° when the summing circuit 154 is operable to take a difference of the initial voltage reference signal Vref1 and the amplitude noise compensation signal 156 to produce the final voltage reference signal Vref2.

It is noted that the transfer function of the summing circuit 154, $h_{SUM}(s)$, may not be ideal. In particular, the transfer function may include a first amplitude response and a first phase response as functions of frequency from the initial voltage reference signal Vref1 to the final voltage reference signal Vref2 and/or may include a second amplitude response and a second phase response as functions of frequency from the amplitude noise compensation signal 156 to the final voltage reference signal Vref2. In this case, the amplitude response of the equalizer 152 is preferably proportional to a quotient of the first and second amplitude responses of the summing circuit 154. The phase response of the equalizer 152 is preferably 180° shifted from difference of the first and second phase responses of the summing circuit 154.

In accordance with at least one further aspect of the present invention, a method of reducing errors in an analog output signal of a digital-to-analog converter may be achieved utilizing suitable hardware, such as that illustrated in FIG. 5, and/or utilizing a manual or automatic process. An automatic process may be implemented utilizing any of the known processors that are operable to execute instructions of a software program. The software program preferably causes the processor (and/or any peripheral systems) to execute certain steps in accordance with one or more aspects of the present invention. In a manual process, the steps themselves would be performed using manual techniques. In either case, the steps and/or actions of the method preferably correspond with the functions discussed hereinabove with respect to at least portions of the hardware of FIG. 5, such as the first and second noise compensation circuits 110, 150.

Figure 6:
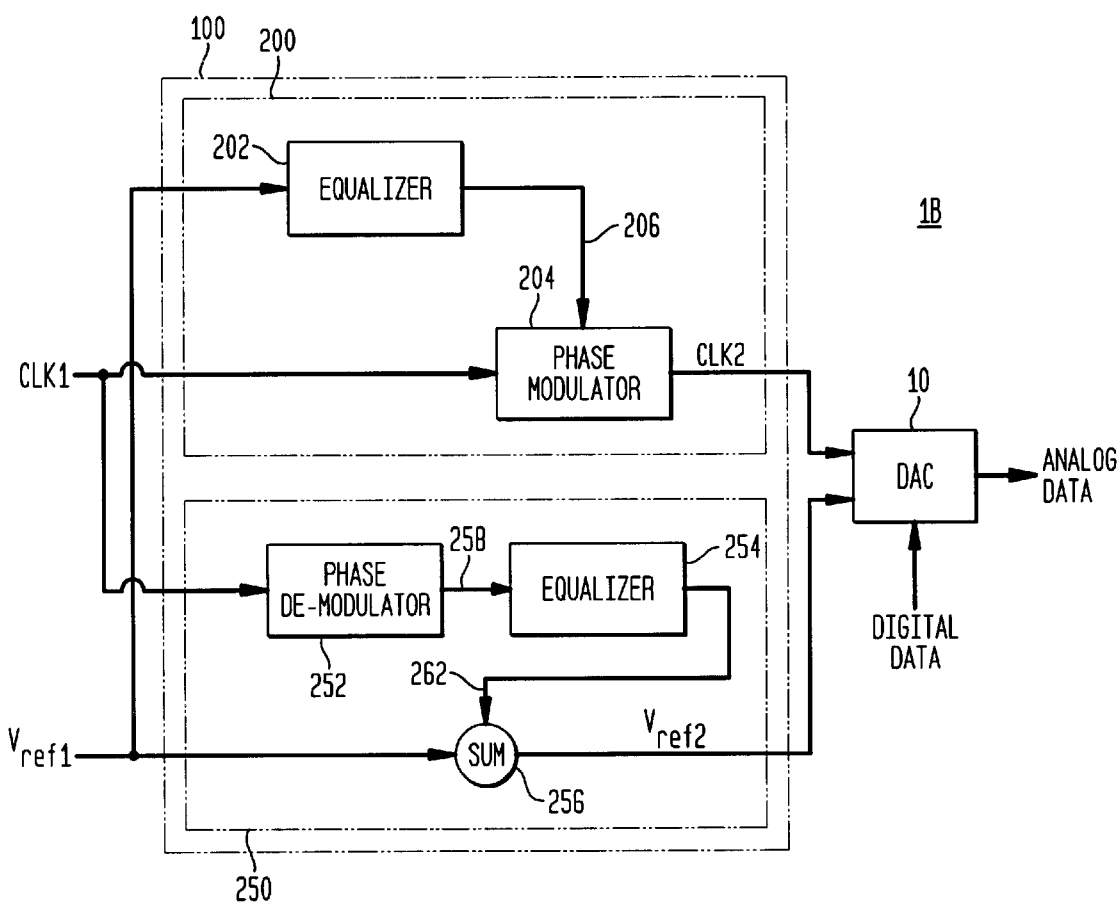
FIG. 6 is a more detailed block diagram of a further noise compensation circuit suitable for use in accordance with at least one further aspect of the present invention.

At least one further aspect of the present invention will now be described with reference to FIG. 6, which is a block diagram of an apparatus 1B suitable for reducing errors in the analog output signal of the DAC 10. FIG. 6 shows a more detailed block diagram of one or more embodiments of the noise compensation circuit 100 shown in FIG. 4. In particular, the noise compensation circuit 100 may include at least one of a first noise compensation circuit 200 and a second noise compensation circuit 250, it being understood that either or both of the noise compensation circuits 200, 250 may be employed without departing from the scope of the invention.

Preferably, the first noise compensation circuit 200 is operable to produce the final word clock signal CLK2 by modifying the initial word clock signal CLK1 as a function of the amplitude noise of the initial voltage reference signal Vref1 such that errors in the analog output signal of the DAC 10 due to the amplitude noise are reduced. The first noise compensation circuit 200 preferably includes a phase modulator (circuit) 204, and an equalizer (circuit) 202. The phase modulator 204 is preferably operable to receive the initial word clock signal CLK1 and vary the phase thereof in accordance with a modulating signal 206 to produce the final word clock signal CLK2. The equalizer 202 is preferably operable to produce the modulating signal 206 from the initial voltage reference signal Vref1.

In accordance with at least one aspect of the invention, a transfer function of the equalizer 202 is preferably designed such that the phase shift imposed by the phase modulator 204 on the initial word clock signal CLK1 compensates for the amplitude noise on the initial voltage reference signal Vref1. Designing this transfer function may be achieved utilizing any of the known system control techniques in the art without departing from the scope of the invention. For example, the transfer function of the equalizer 202 may be designed by establishing a desired relationship between the transfer functions of the phase modulator 204, the DAC 10, and the equalizer 202. This relationship may be obtained as follows. An overall transfer function from the initial voltage reference signal Vref1 to the analog output signal of the DAC 10 as a function of frequency (e.g., the frequency of the amplitude noise and/or the jitter) may be expressed as follows:

$$DACOUT(s)/Vref1(s) = (h_{EQ}(s) + CLK1(s)) \cdot h_{DAC,CLK2}(s) + h_{DAC,Vref2}(s),$$

where the transfer function of the phase modulator 204, $h_{PM}(s)$, is ideally a summing function with respect to any jitter on the initial word clock signal CLK1; $h_{EQ}(s)$ is the transfer function of the equalizer 202; $h_{DAC,CLK2}(s)$ is the transfer function of the DAC 10 from the final word clock signal CLK2 to the analog output signal; and $h_{DAC,Vref2}(s)$ is the transfer function of the DAC 10 from the final voltage reference signal Vref2 to the analog output signal. It is assumed that the jitter on the initial word clock signal CLK1 is zero. Setting the overall transfer function from the initial voltage reference signal Vref1 to the analog output signal of the DAC 10 equal to zero and solving for the transfer function of the equalizer 202, yields:

$$h_{EQ}(s) = -h_{DAC,Vref2}(s)/h_{DAC,CLK2}(s)$$

Additional details concerning the above equations will now be discussed. The transfer function of the phase modulator 204, $h_{PM}(s)$, may include the ideal summing function as well as a first amplitude response and a first phase response as functions of frequency from the initial word clock signal CLK1 to the final word clock signal CLK2. The transfer function of the phase modulator, $h_{PM}(s)$, may also include a second amplitude response and a second phase response as functions of frequency from the modulating signal 206 to the final word clock signal CLK2. The transfer function of the equalizer 202, $h_{EQ}(s)$, may include an amplitude response and a phase response as functions of frequency. The transfer function of the DAC 10 from the final word clock signal CLK2 to the analog output signal, $h_{DAC,CLK2}(s)$, may include a first amplitude response and a first phase response as functions of frequency and the transfer function of the DAC 10 from the final voltage reference signal Vref2 to the analog output signal, $h_{DAC,Vref2}(s)$, may include a second amplitude response and a second phase response as functions of frequency.

As the above equations for the transfer function of the equalizer 202, $h_{EQ}(s)$, suggests, it is believed that advantageous results are obtained when the amplitude response of the equalizer 202 is proportional to a quotient of the second to the first amplitude responses of the transfer functions of the DAC 10. Indeed, it is believed that when the amplitude response of the equalizer 202 is so designed, substantial correction for the amplitude noise on the initial voltage reference signal Vref1 is obtained by modulating the phase of the initial word clock CLK1. In order to achieved the desired compensation, the phase response of the equalizer 202 is preferably about 180° shifted from a difference of the second and the first phase of responses of the DAC 10.

Assuming that the transfer function of the phase modulator 204, $h_{PM}(s)$, is not ideal (i.e., includes the second amplitude response and the second phase response from the modulating signal 206 to the final word clock signal CLK2), the overall transfer function from the initial voltage reference Vref1 to the analog output signal of the DAC 10 as a function of frequency (e.g., the frequency of the amplitude noise and/or the jitter) may be expressed as follows:

$$DACOUT(s)/Vref1(s) = (h_{PM2}(s) \cdot h_{EQ}(s) \cdot h_{DAC,CLK2}(s) + h_{DAC,Vref2}(s),$$

where $h_{PM2}(s)$ is the portion of the transfer function of the phase modulator 204 that includes the second amplitude response and second phase response as functions of frequency. Setting the overall transfer function equal to zero and solving for the transfer function of the equalizer 202, yields:

$$h_{EQ} = -h_{DAC,Vref2}(s)/(h_{PM2}(s) \cdot h_{DAC,CLK2}(s)).$$

As the above equation for the transfer function of the equalizer 202, $h_{EQ}(s)$, suggests, it is believed that advantageous results are obtained when the amplitude response of the equalizer 202 is inversely proportional to the second amplitude response of the phase modulator 204, $h_{PM2}(s)$. In order to achieve the desired noise compensation, the phase response of the equalizer 202 in this case is preferably about 180° shifted from a difference of (i) the second phase response of the DAC 10, and (ii) a sum of the first phase response of the DAC 10 and the second phase response of the transfer function of the phase modulator 204.

Figure 3A:
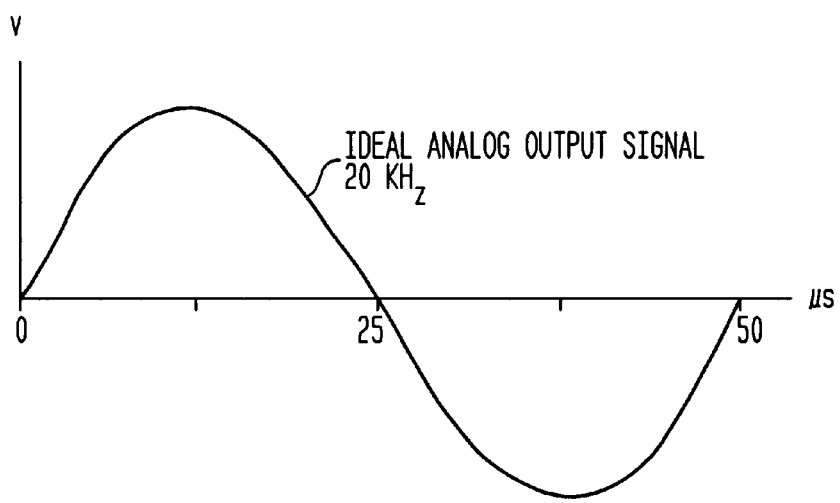
FIG. 3A is an ideal analog output signal that may be produced by the DAC of FIG. 1 assuming that the word clock signal and voltage reference signals are ideal.
Figure 3B:
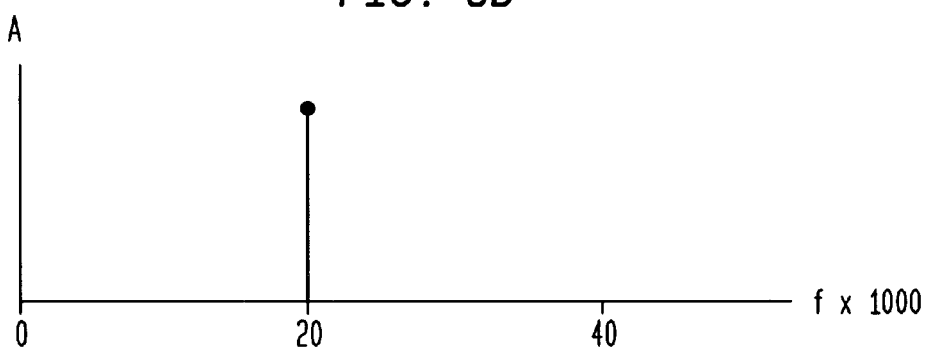
FIG. 3B is a graph of the frequency spectrum of the ideal analog output signal of FIG. 3A.
Figure 3C:
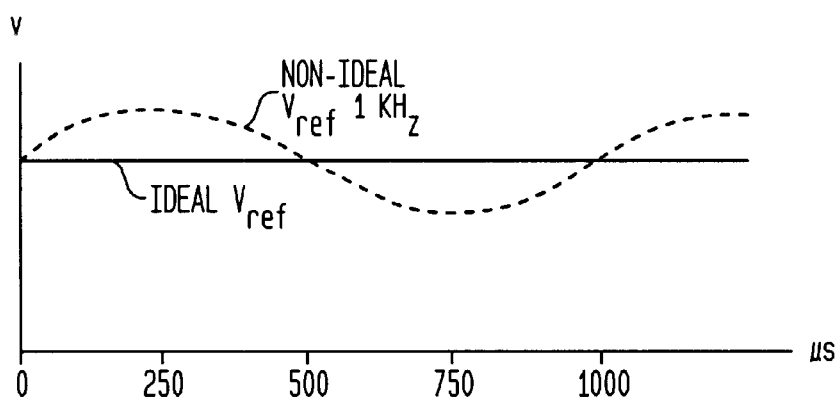
FIG. 3C is a graph illustrating an ideal voltage reference signal and a non-ideal voltage reference signal that may be input to the DAC of FIG. 1.
Figure 3D:
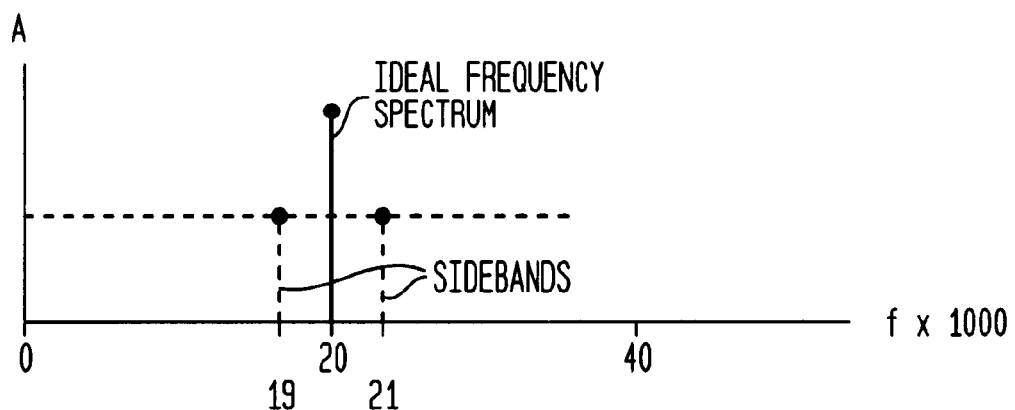
FIG. 3D is a graph illustrating a frequency spectrum of the analog output signal of FIG. 3A assuming at least one of a non-ideal word clock signal and a non-ideal voltage reference signal.
Figure 3E:
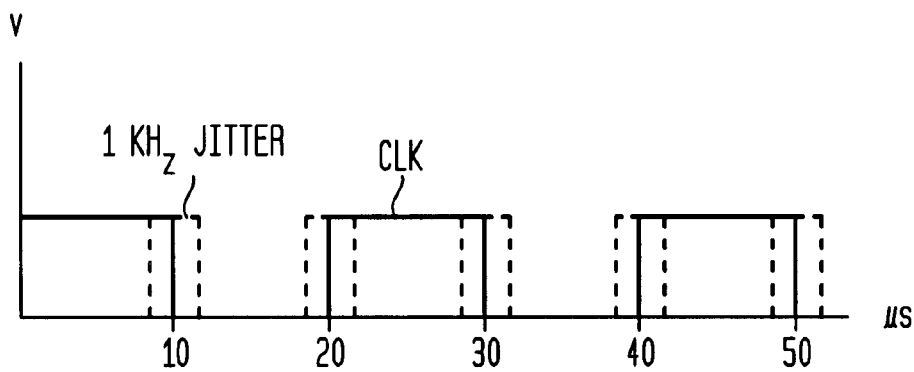
FIG. 3E is a graph illustrating an ideal and a non-ideal word clock signal that may be input to the DAC of FIG. 1.
Figure 3F:
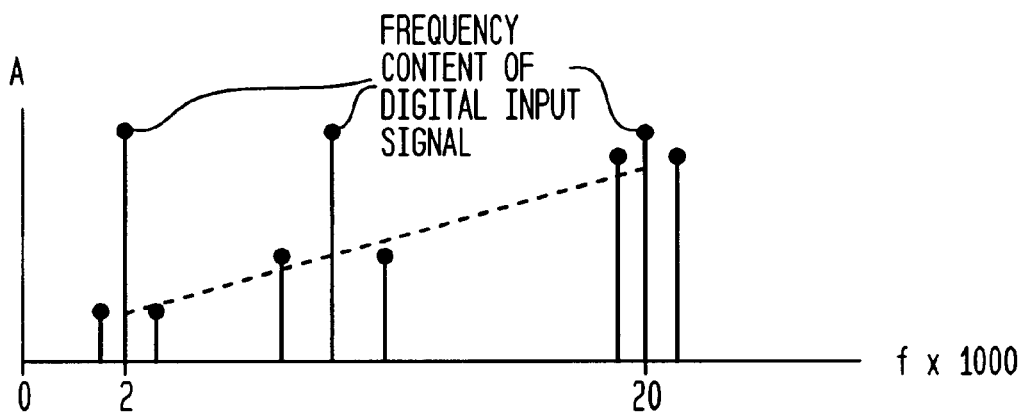
FIG. 3F is a graph illustrating the frequency spectrum of the analog output signal of FIG. 3A assuming a non-ideal word clock signal.

As discussed above respect to FIGS. 3E and 3F, the transfer function of the DAC 10 from the final word clock signal CLK2 to the analog output signal may include a dependency on the frequency content of the digital input signal when the phase of the final word clock signal CLK2 is time variant. In order to take this frequency dependency of the DAC 10 into account when compensating for noise on the final word clock signal CLK2 (even when that noise may be desirable in order to compensate for amplitude noise on the initial voltage reference signal Vref1), the overall transfer function from the initial voltage reference signal Vref1 to the analog output signal of the DAC 10 as a function of frequency (e.g., the frequency of the amplitude noise and/or the jitter) may be expressed as follows:

$$DACOUT(s)/Vref1(s) = h_{EQ}(s) \cdot D(s) \cdot h_{DAC,CLK2}(s) + h_{DAC,Vref2}(s),$$

where D(s) is the frequency spectrum representing the frequency content of the digital input signal. Setting the overall transfer function to zero and solving for the transfer function of the equalizer 202, yields:

$$h_{EQ}(s) = -h_{DAC,Vref2}(s)/(D(s) \cdot h_{DAC,CLK2}(s)).$$

As the above equation for the transfer function of the equalizer 202, $h_{EQ}(s)$, suggests, it is believed that advantageous results are obtained when the amplitude response of the equalizer 202 is inversely proportional to the frequency spectrum of the digital input signal, D(s). In order to achieve the desired noise compensation, the phase response of the equalizer 202 is preferably about 180° shifted from a difference of (i) the second phase response of the DAC 10, and (ii) a sum of the first phase response of the DAC 10 and a phase spectrum of the digital input signal. It may be seen from the above that the equalizer 202 can produce a modulating signal 206 that causes the phase modulator 204 to modulate the phase of the initial word clock signal CLK1 in a way that theoretically compensates for the amplitude noise on the initial voltage reference signal Vref1 and compensates for the sensitivity of the DAC 10 to phase modulation on the final word clock signal CKL2 (i.e., the sensitivity to the frequency content of the digital input signal). In cases where the frequency content (e.g., the frequency spectrum) of the digital input signal is known and does not change as a function of time, then the transfer function of the equalizer 202, $h_{EQ}(s)$, may be time invariant. When the frequency content of the digital input signal varies as a function of time, then the transfer function of the equalizer 202 would preferably be time variant and inversely proportional to the time variant frequency spectrum of the digital input signal. Any of the known techniques for providing such a time variant transfer function for the equalizer 202 may be employed without departing from the scope of the invention.

When the frequency content of the digital input signal is not known and/or is time variant and a time invariant transfer function for the equalizer 202 is desired, then a determination may be made as to the transfer function of the equalizer 202 which it is believed yields advantageous results even though the transfer function is time invariant. In particular, the amplitude response of the equalizer 202 may be preferably inversely proportional to and corrected at at least one magnitude within the frequency spectrum of the digital input signal. In other words, an assumption as to the overall range of frequencies that may be included in the frequency spectrum of the digital input data may be made and the corresponding magnitude of one such frequency may be selected for use in determining the transfer function of the equalizer 202.

Figure 7A:
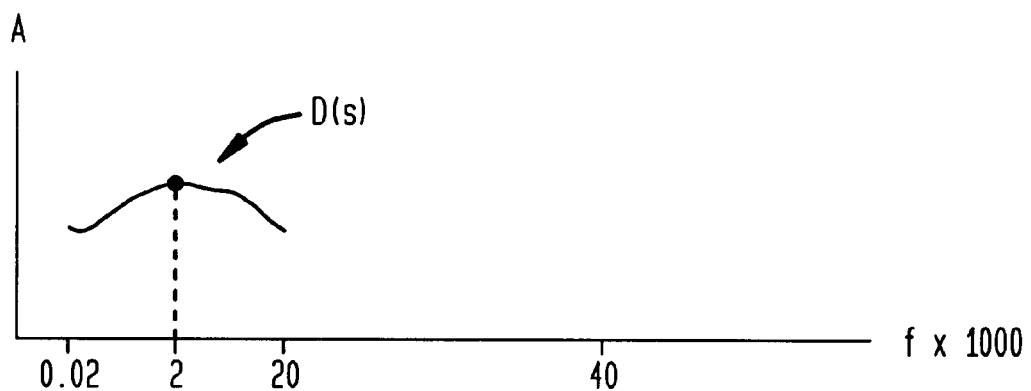
FIG. 7A is a graph illustrating an example of the frequency spectrum of the digital input signal of a digital-to-analog converter.
Figure 7B:
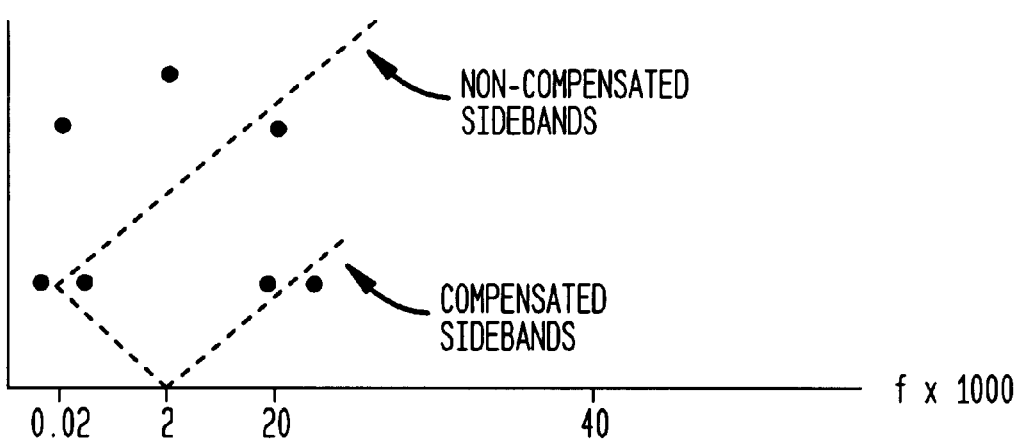
FIG. 7B is a graph illustrating an improved frequency spectrum of an analog output signal assuming a non-ideal word clock signal in accordance with at least one further aspect of the present invention.

To further illustrate this aspect of the invention, reference is now made to FIG. 7A which is a graph showing an illustrative frequency spectrum of the digital input data at a particular instant in time. It is assumed for the purposes of this example that the frequency content of the digital input signal includes frequencies between about 20 Hz and 20 KHz. A magnitude corresponding to one frequency within the range, namely 2 KHz, may be utilized in determining the transfer function of the equalizer 202. In particular, the inverse of that magnitude would be utilized as a proportionality value for the amplitude response of the equalizer 202 at the frequency of 2 KHz. Consequently, any sideband that would tend to appear in the frequency spectrum of the analog output signal from the DAC 10 due to the phase modulation imposed by the phase modulator 204 on the final word clock signal CLK2 would be theoretically perfectly compensated for. As shown in FIG. 7B, the frequency spectrum of the analog output signal from the DAC 10 consistent with the above example shows no sidebands at the frequency of 2 KHz (due to the phase modulation on the final word clock signal CLK2). On the other hand, sidebands do exist in the frequency spectrum of the analog output signal of the DAC 10 at other frequencies due to the sensitivity of the DAC 10 to the frequency content of the digital input signal. Nevertheless, an envelope of the sidebands (shown in dashed line) ramps downwardly from low frequencies toward the frequency of ideal compensation, here 2 KHz, and ramps upwardly from this frequency towards higher frequencies. The envelope of the sidebands without such compensation, however, is (shown in dash line) and is significantly higher than the compensated envelope.

Turning again to FIG. 6, the second noise compensation circuit 250 is preferably operable to produce the final voltage reference signal Vref2 in response to the initial voltage reference Vref1 and the initial word clock signal CLK1 such that the final voltage reference signal Vref2 is modified in accordance with the timing noise on the initial word clock signal CLK1. The second noise compensation circuit 250 preferably includes a combining circuit, a phase demodulator (circuit) 252, and an equalizer (circuit) 254. The combining circuit is preferably operable to aggregate the initial voltage reference signal Vref1 and an amplitude noise compensation signal 262 to produce the final voltage reference signal Vref2. Preferably, the combining circuit includes a summing circuit 256 operable to one of add the initial voltage reference signal Vref1 and the amplitude noise compensation signal 262, and subtract the amplitude noise compensation signal 262 from the initial voltage reference signal Vref1 to produce the final voltage reference signal Vref2. The phase demodulator 252 is preferably operable to produce a demodulated signal 258 from the initial word clock signal CKL1 having an amplitude that is proportional to the amplitude of the timing noise on the initial word clock signal CKL1. The equalizer 254 is preferably operable to produce the amplitude noise compensation signal 262 from the demodulated signal 258.

In accordance with at least one aspect of the present invention, a transfer function of the equalizer 254 is preferably designed such that the sum (or difference) produced by the summing circuit 256 compensates for any jitter on the initial word clock signal CLK1. As was the case with the first noise compensation circuit 200, designing the transfer function of the equalizer 254 may be achieved using any of the known system control techniques in the art. For example, the transfer function of equalizer 254 may be designed by establishing a desired relationship between the transfer functions of the phase demodulator 252, the summing circuit 256, the DAC 10, and the equalizer 254. This relationship may be obtained as follows: An overall transfer function from the initial word clock signal CLK1 to the analog output signal of the DAC 10 as a function of frequency (e.g., the frequency of amplitude noise and/or the jitter) may be expressed as follows:

$$DACOUT(s)/CLK1(s) = h_{DAC,CLK2}(s) + h_{PDM}(s) \cdot h_{EQ}(s) \cdot h_{DAC,Vref2}(s),$$

where it is assumed that there is no amplitude noise on the initial voltage reference signal Vref1; the transfer function of the summing circuit 256, $h_{SUM}(s)$, is ideal; and $h_{PDM}(s)$ is the transfer function of the phase demodulator 252. Setting the overall transfer function equal to zero and solving for the transfer function of the equalizer 254, yields:

$$h_{EQ}(s) = -h_{DAC,CLK2}(s)/(h_{PDM}(s) \cdot h_{DAC,Vref2}(s)).$$

Additional details concerning the above equations will now be discussed. The transfer function of the summing circuit 256, $h_{SUM}(s)$, may include an ideal summing function as well as an amplitude response and a phase response as functions of frequency from the amplitude noise compensation signal 262 to the final voltage reference signal Vref2. The transfer function of the phase demodulator 252, $h_{PDM}(s)$, may include an amplitude response and a phase response as functions of frequency. Similarly, the transfer function of the equalizer 254, $h_{EQ}(s)$, may include an amplitude response and a phase response as functions of the frequency.

As the above equations for the transfer function of the equalizer 254, $h_{EQ}(s)$, suggests, it is believed that advantageous results are obtained when the amplitude response of the equalizer circuit is (i) proportional to a quotient of the first to second amplitude responses of the DAC 10, and (ii) inversely proportional to the amplitude response of the phase demodulator 252. Indeed, it is believed that when the amplitude response of the equalizer 254 is so designed, substantial compensation for jitter on the initial word clock signal CLK1 may be obtained by modulating the amplitude of the initial voltage reference signal Vref1 to produce the final voltage reference signal Vref2. It is preferred that the amplitude response of the equalizer 254 is approximately zero at zero frequency so that the amplitude information of the initial voltage reference signal Vref1 is neither duplicated nor lost due to the summing action of the summing circuit 256.

In order to achieve the desired compensation, the phase response of the equalizer 254 is preferably about 180° shifted from a difference of (i) the first phase response of the DAC 10, and (ii) a sum of the second phase response of the DAC 10 and the phase response of the phase demodulator 252, when the summing circuit 256 is operable to add the initial voltage reference signal Vref1 and the amplitude noise compensation signal 256 to produce the final voltage reference signal Vref2. Alternatively, the phase response of the equalizer 254 is preferably about zero degrees shifted from the above difference when the summing circuit is operable to subtract the amplitude noise compensation signal 262 from the initial voltage reference signal Vref1 to produce the final voltage reference signal Vref2.

Assuming that the transfer function of the summing circuit 256 is not ideal, e.g., it includes a transfer function, $h_{SUM}(s)$, that includes amplitude and phase responses as functions of frequency from the modulating signal 262 to the final voltage reference signal Vref2, the overall transfer function from the initial word clock signal CLK1 to the analog output signal of the DAC 10 as a function of frequency (e.g., the frequency of the amplitude noise and/or the jitter) may be expressed as follows:

$$DACOUT(s)/CLK1(s) = h_{DAC,CLK2}(s) + h_{PDM}(s) \cdot h_{EQ}(s) \cdot h_{SUM}(s) \cdot h_{DAC,Vref2}(s),$$

where it is assumed that there is no amplitude noise on the initial voltage reference signal Vref1; and $h_{SUM}(s)$ is the transfer function of the summing circuit 256 from the amplitude noise compensation signal 262 to the final voltage reference signal Vref2. Setting the overall transfer function equal to zero and solving for the transfer function of the equalizer 254, yields:

$$h_{EQ}(s) = -h_{DAC,CLK2}(s)/(h_{PDM}(s) \cdot h_{SUM}(s) \cdot h_{DAC,Vref2}(s)).$$

As the above equation for the transfer function of the equalizer 254, $h_{EQ}(s)$, suggests, it is believed that advantageous results are obtained when the amplitude response of the equalizer 254 is inversely proportional to an amplitude response of the transfer function of the summing circuit 256 from the modulating signal 262 to the final voltage reference signal Vref2. In order to achieve the desired compensation under these circumstances, the phase response of the equalizer 254 is preferably about 180° shifted from a difference of (i) the first phase response of the DAC 10, and (ii) a sum of the second phase response of the DAC 10, the phase response of the phase demodulator 252, and the phase response of the summing circuit 256, when the summing circuit 256 is operable to add the initial voltage reference signal Vref1 and the amplitude noise compensation signal 262 to produce the final voltage reference signal Vref2. Alternatively, the phase response of the equalizer circuit is preferably about zero degrees shifted from the above difference when the summing circuit is operable to subtract the amplitude noise compensation signal 262 from the initial voltage reference signal Vref1 to produce the final voltage reference signal Vref2.

As discussed above, the DAC 10 is sensitive to the frequency content of the digital input signal when jitter is present on the final word clock CLK2 (e.g., due to jitter on the initial word clock CLK1). Errors in the analog output signal of the DAC 10 due to this sensitivity may be compensated for utilizing the second noise compensation circuit 250 by establishing a desired relationship between the transfer functions of the phase demodulator 252, the summing circuit 256, the DAC 10, and the equalizer 254. This relationship may be obtained as follows. An overall transfer function from the initial word clock signal CLK1 to the analog output signal of the DAC 10 that includes the sensitivity of the DAC 10 to the frequency content of the digital input signal may be expressed as follows:

$$DACOUT(s)/CLK1(s) = D(s) \cdot h_{DAC,CLK2}(s) + h_{PDM}(s) \cdot h_{EQ}(s) \cdot h_{DAC,Vref2}(s),$$

where it is assumed that no amplitude noise exists on the initial voltage reference signal Vref1; and D(s) is the frequency spectrum of the digital input signal. Setting the overall transfer function to zero and solving for the transfer function of the equalizer 254, yields:

$$h_{EQ}(s) = D(s) \cdot h_{DAC,CLK2}(s)/(h_{PDM}(s) \cdot h_{DAC,Vref2}(s)).$$

As the above equation for the transfer function of the equalizer 254, $h_{EQ}(s)$, suggests, it is believed that advantageous results are obtained when the amplitude response of the equalizer circuit 254 is proportional to the frequency spectrum of the digital input signal. Further, it preferred that the phase response of the equalizer 254 is about 180° shifted from a difference of (i) a sum of the first phase response of the DAC 10 and the phase of the digital input signal as a function of frequency; and (ii) a sum of the second phase response of the DAC 10 and the phase response of the phase demodulator 252, when the summing circuit is operable to add the initial voltage reference signal Vref1 and the amplitude noise compensation signal 262 to produce the final voltage reference signal Vref2. Alternatively, the phase response of the equalizer 254 is preferably about zero degrees shifted from the above difference when the summing circuit is operable to subtract the amplitude noise compensation signal 262 from the initial voltage reference signal Vref1 to produce the final voltage reference signal Vref2.

Assuming that the frequency spectrum of the digital input signal, D(s), is known and is time invariant, the transfer function of the equalizer 254 may be time invariant and will theoretically cause the. first noise compensation circuit 250 to perfectly compensate for jitter on the initial word clock signal CLK1. When the frequency content of the digital input signal varies as a function of time, however, then the transfer function of the equalizer 254 is likewise time variant and proportional to the time varying frequency spectrum of the digital input signal. Any of the known techniques for varying the transfer function of the equalizer 254 consistent with the above may be utilized without departing from the spirit and scope of the present invention.

When it is desirable to employ a time invariant transfer function for the equalizer 254 and/or the frequency content of the digital input signal is neither known nor time invariant, then the transfer function of the equalizer 254 may be designed to compensate for the sensitivity of the DAC 10 to the frequency content of the digital input signal at a specific frequency and thereby reduce the overall envelope of the sidebands of the frequency spectrum of the analog output signal of the DAC 10. In particular, the amplitude response of the equalizer 254 may be preferably proportional to at least one magnitude within the frequency spectrum of the digital input signal (see FIGS. 7A–7B).

In accordance with at least one further aspect of the present invention, a method of reducing errors in an analog output signal of a digital-to-analog converter may be achieved utilizing suitable hardware, such as that illustrated in FIG. 6 and/or utilizing a manual or automatic process. An automatic process may be implemented using any of the known processors that are operable to execute instructions of a software program. The software program preferably causes the processor (and/or any peripheral systems) to execute certain steps in accordance with one or more aspects of the present invention. In a manual process, the steps themselves would be performed using manual techniques. In either case, the steps and/or actions of the method would correspond to the functions described hereinabove with respect to at least portions of the hardware of FIG. 6, e.g., one or both of the first and second noise compensation circuits 200, 250.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. An apparatus, comprising:
   a digital-to-analog converter operable to produce an analog output signal in response to a digital input signal, a final word clock signal, and a final voltage reference signal; and
   a noise compensation circuit operable to receive an initial word clock signal and an initial voltage reference signal and to produce the final word clock signal and the final voltage reference signal such that errors in the analog output signal due to at least one of timing noise on the initial word clock signal and amplitude noise on the initial voltage reference signal are reduced.

2. The apparatus of claim 1, wherein
   the noise compensation circuit includes at least one of a first noise compensation circuit and a second noise compensation circuit,
   the first noise compensation circuit is operable to receive the initial word clock signal including timing information and timing noise, and to at least partly cancel the timing noise from the initial word clock signal to produce the final word clock signal, and
   the second noise compensation circuit is operable to receive the initial voltage reference signal including amplitude information and amplitude noise, and to at least partly cancel the amplitude noise from the initial voltage reference signal to produce the final voltage reference signal.

3. The apparatus of claim 2, wherein the first noise compensation circuit includes a phase modulator circuit operable to receive the initial word clock signal and vary the phase thereof in accordance with a modulating signal to produce the final word clock signal.

4. The apparatus of claim 3, wherein the first noise compensation circuit further includes a phase demodulator circuit operable to receive the initial word clock signal and produce a demodulated signal having an amplitude that is proportional to the timing noise.

5. The apparatus of claim 4, wherein the first noise compensation circuit further includes an equalizer circuit operable to produce the modulating signal from the demodulated signal.

6. The apparatus of claim 5, wherein
   the phase modulator circuit has a transfer function from the initial word clock signal to the final word clock signal such that timing noise on the final word clock signal as a function of frequency is proportional to a sum of (i) a product of the timing noise on the initial word clock signal and a first amplitude response of the phase modulator circuit as functions of frequency, and (ii) a product of the modulating signal and a second amplitude response of the phase modulator circuit as functions of frequency,
   the phase demodulator circuit has a transfer function from the initial word clock signal to the demodulated signal such that the demodulated signal as a function of frequency is proportional to a product of the timing noise on the initial word clock signal and an amplitude response of the phase demodulator circuit as functions of frequency, and
   the equalizer circuit has a transfer function from the demodulated signal to the modulating signal as a function of frequency such that that timing noise on the final word clock signal as a function of frequency is substantially zero over at least some range of frequencies.

7. The apparatus of claim 6, wherein the transfer function of the equalizer circuit includes an amplitude response that is inversely proportional to the amplitude response of the phase demodulator circuit.

8. The apparatus of claim 7, wherein the transfer function of the equalizer circuit includes a phase response as a function of frequency, the transfer function of the phase demodulator circuit includes a phase response as a function of frequency, and the phase response of the equalizer circuit is about 180 degrees shifted from the phase response of the phase demodulator circuit.

9. The apparatus of claim 7, wherein the amplitude response of the equalizer circuit is (i) inversely proportional to a product of the amplitude response of the phase demodulator circuit and the second amplitude response of the phase modulator circuit, and (ii) proportional to the first amplitude response of the phase modulator circuit.

10. The apparatus of claim 9, wherein the transfer function of the equalizer circuit includes a phase response as a function of frequency, the transfer function of the phase demodulator circuit includes a phase response as a function of frequency, the transfer function of the phase modulator circuit includes a first phase response as a function of frequency from the initial word clock signal to the final word clock signal and a second phase response as a function of frequency from the modulating signal to the final word clock signal, and the phase response of the equalizer circuit is about 180 degrees shifted from a difference of (i) the first phase response of the phase modulator circuit, and (ii) a sum of the phase response of the phase demodulator circuit and the second phase response of the phase modulator circuit.

11. The apparatus of claim 2, wherein the second noise compensation circuit includes a combining circuit operable to aggregate the initial voltage reference signal and an amplitude noise compensation signal to produce the final voltage reference signal.

12. The apparatus of claim 11, wherein the combining circuit includes a summing circuit operable to one of add the initial voltage reference signal and the amplitude noise compensation signal, and subtract the initial voltage reference signal and the amplitude noise compensation signal, to produce the final voltage reference signal.

13. The apparatus of claim 12, wherein the second noise compensation circuit further includes an equalizer circuit operable to produce the amplitude noise compensation signal from the initial voltage reference signal.

14. The apparatus of claim 13, wherein
the summing circuit has a transfer function from the initial voltage reference signal to the final voltage reference signal such that the final voltage reference signal as a function of frequency is proportional to a sum of the initial voltage reference signal and the amplitude noise compensation signal as functions of frequency, and
the equalizer circuit has a transfer function from the initial voltage reference signal to the amplitude noise compensation signal that includes an amplitude response as a function of frequency such that amplitude noise on the final voltage reference signal as a function of frequency is substantially zero over at least some range of frequencies.

15. The apparatus of claim 14, wherein the amplitude response of the equalizer circuit is substantially a constant over at least the range of frequencies.

16. The apparatus of claim 15, wherein the constant is about unity.

17. The apparatus of claim 15, wherein the amplitude response of the equalizer circuit is about zero at zero frequency.

18. The apparatus of claim 15, wherein the transfer function of the equalizer circuit includes a phase response as a function of frequency that is about 180 degrees over at least the range of frequencies when the summing circuit is operable to add the initial voltage reference signal and the amplitude noise compensation signal to produce the final voltage reference signal.

19. The apparatus of claim 15, wherein the transfer function of the equalizer circuit includes a phase response as a function of frequency that is about zero degrees over at least the range of frequencies when the summing circuit is operable to take a difference of the initial voltage reference signal and the amplitude noise compensation signal to produce the final voltage reference signal.

20. The apparatus of claim 14, wherein the transfer function of the summing circuit as a function of frequency is such that the final voltage reference signal as a function of frequency is proportional to a sum of (i) a product of the initial voltage reference signal and a first amplitude response as functions of frequency, and (ii) a product of the amplitude noise compensation signal and a second amplitude response as functions of frequency.

21. The apparatus of claim 20, wherein the amplitude response of the equalizer circuit is substantially proportional to a quotient of the first and second amplitude responses of the summing circuit.

22. The apparatus of claim 1, wherein:
the initial word clock signal includes timing information and the timing noise,
the initial voltage reference signal includes amplitude information and the amplitude noise, and
the noise compensation circuit is further operable to at least one of (i) produce the final word clock signal by modifying the initial word clock signal as a function of the amplitude noise such that errors in the analog output signal due to the amplitude noise are reduced, and (ii) produce the final voltage reference signal by modifying the initial voltage reference signal as a function of the timing noise such that errors in the analog output signal due to the timing noise are reduced.

23. The apparatus of claim 22, wherein
the noise compensation circuit includes at least one of a first noise compensation circuit and a second noise compensation circuit,
the first noise compensation circuit is operable to produce the final word clock signal in response to the initial word clock signal and the initial voltage reference signal, and
the second noise compensation circuit is operable to produce the final voltage reference signal in response to the initial voltage reference signal and the initial word clock signal.

24. The apparatus of claim 23, wherein the first noise compensation circuit includes a phase modulator circuit operable to receive the initial word clock signal and vary the phase thereof in accordance with a modulating signal to produce the final word clock signal.

25. The apparatus of claim 24, wherein the first noise compensation circuit further includes an equalizer circuit operable to produce the modulating signal from the initial voltage reference signal.

26. The apparatus of claim 25, wherein:
the phase modulator circuit has a first transfer function from the initial word clock signal to the final word clock signal such that timing noise on the final word clock signal as a function of frequency is proportional to a sum of the timing noise on the initial word clock signal and the modulating signal as functions of frequency,
the digital-to-analog converter has a first transfer function from the final word clock signal to the analog output signal as a function of frequency and a second transfer function from the final voltage reference signal to the analog output signal as a function of frequency, and
the equalizer circuit has a transfer function from the initial voltage reference signal to the modulating signal as a function of frequency such that errors in the analog output signal due to the amplitude noise are reduced.

27. The apparatus of claim 26, wherein the transfer function of the equalizer circuit includes an amplitude response that is proportional to a quotient of second to first amplitude responses of the second and first transfer functions of the digital-to-analog converter, respectively.

28. The apparatus of claim 26, wherein the transfer function of the equalizer circuit includes a phase response that is about 180 degrees shifted from a difference of second and first phase responses of the second and first transfer functions of the digital-to-analog converter, respectively.

29. The apparatus of claim 28, wherein the amplitude response of the equalizer circuit is inversely proportional to an amplitude response of a second transfer function of the phase modulator circuit from the modulating signal to the final word clock signal as a function of frequency.

30. The apparatus of claim 29, wherein the phase response of the equalizer circuit is about 180 degrees shifted from a difference of (i) the second phase response of the digital-to-analog converter, and (ii) a sum of the first phase response of the digital-to-analog converter and a phase response of the second transfer function of the phase modulator circuit from the modulating signal to the final word clock signal as functions of frequency.

31. The apparatus of claim 28, wherein the amplitude response of the equalizer circuit is inversely proportional to a frequency spectrum of the digital input signal.

32. The apparatus of claim 31, wherein the phase response of the equalizer circuit is about 180 degrees shifted from a difference of (i) the second phase response of the digital-to-analog converter, and (ii) a sum of the first phase response of the digital-to-analog converter and a phase of the digital input signal as a function of frequency.

33. The apparatus of claim 31, wherein the amplitude response of the equalizer circuit is inversely proportional to at least one magnitude within the frequency spectrum of the digital input signal.

34. The apparatus of claim 23, wherein the second noise compensation circuit includes a combining circuit operable to aggregate the initial voltage reference signal and an amplitude noise compensation signal to produce the final voltage reference signal.

35. The apparatus of claim 34, wherein the combining circuit includes a summing circuit operable to one of add the initial voltage reference signal and the amplitude noise compensation signal, and subtract the initial voltage reference signal and the amplitude noise compensation signal, to produce the final voltage reference signal.

36. The apparatus of claim 35, wherein the second noise compensation circuit further includes a phase demodulator circuit operable to produce a demodulated signal from the initial word clock signal having an amplitude that is proportional to the timing noise.

37. The apparatus of claim 36, wherein the second noise compensation circuit further includes an equalizer circuit operable to produce the amplitude noise compensation signal from the demodulated signal.

38. The apparatus of claim 37, wherein
the phase demodulator circuit has a transfer function from the initial word clock signal to the demodulated signal that includes an amplitude response and a phase response as functions of frequency such that the amplitude of the demodulated signal is proportional to the timing noise,
the digital-to-analog converter has a first transfer function from the final word clock signal to the analog output signal that includes a first amplitude response and a first phase response as functions of frequency and a second transfer function from the final voltage reference signal to the analog output signal that includes a second amplitude response and a second phase response as functions of frequency, and
the equalizer circuit has a transfer function from the demodulated signal to the amplitude noise compensation signal that includes an amplitude response and a phase response as functions of frequency such that errors in the analog output signal due to the timing noise are reduced.

39. The apparatus of claim 38, wherein the amplitude response of the equalizer circuit is (i) proportional to a quotient of the first to second amplitude responses of the first and second transfer functions of the digital-to-analog converter, respectively, and (ii) inversely proportional to the amplitude response of the phase demodulator circuit.

40. The apparatus of claim 39, wherein the phase response of the equalizer circuit is one of:
about 180 degrees shifted from a difference of (i) the first phase response of the first transfer function of the digital-to-analog converter, and (ii) a sum of the second phase response of the second transfer function of the digital-to-analog converter and the phase response of the phase demodulator circuit, when the summing circuit is operable to add the initial voltage reference signal and the amplitude noise compensation signal to produce the final voltage reference signal, and
about zero degrees shifted from a difference of (i) the first phase response of the first transfer function of the digital-to-analog converter, and (ii) a sum of the second phase response of the second transfer function of the digital-to-analog converter and the phase response of the phase demodulator circuit, when the summing circuit is operable to subtract the initial voltage reference signal and the amplitude noise compensation signal to produce the final voltage reference signal.

41. The apparatus of claim 40, wherein the amplitude response of the equalizer circuit is inversely proportional to an amplitude response of a transfer function of the summing circuit from the amplitude noise compensation signal to the final voltage reference signal as a function of frequency.

42. The apparatus of claim 41, wherein the phase response of the equalizer circuit is one of:
about 180 degrees shifted from a difference of (i) the first phase response of the first transfer function of the digital-to-analog converter, and (ii) a sum of the second phase response of the second transfer function of the digital-to-analog converter, the phase response of the phase demodulator circuit, and a phase response of the transfer function of the summing circuit, when the summing circuit is operable to add the initial voltage reference signal and the amplitude noise compensation signal to produce the final voltage reference signal, and about zero degrees shifted from a difference of (i) the first phase response of the first transfer function of the digital-to-analog converter, and (ii) a sum of the second phase response of the second transfer function of the digital-to-analog converter, the phase response of the phase demodulator circuit, and a phase response of the transfer function of the summing circuit, when the summing circuit is operable to subtract the initial voltage reference signal and the amplitude noise compensation signal to produce the final voltage reference signal.

43. The apparatus of claim 40, wherein the amplitude response of the equalizer circuit is proportional to a frequency spectrum of the digital input signal.

44. The apparatus of claim 43, wherein the phase response of the equalizer circuit is one of:

about 180 degrees shifted from a difference of (i) a sum of the first phase response of the first transfer function of the digital-to-analog converter and a phase of the digital input signal as a function of frequency, and (ii) a sum of the second phase response of the second transfer function of the digital-to-analog converter and the phase response of the phase demodulator circuit, when the summing circuit is operable to add the initial voltage reference signal and the amplitude noise compensation signal to produce the final voltage reference signal, and about zero degrees shifted from a difference of (i) a sum of the first phase response of the first transfer function of the digital-to-analog converter and a phase of the digital input signal as a function of frequency, and (ii) a sum of the second phase response of the second transfer function of the digital-to-analog converter and the phase response of the phase demodulator circuit, when the summing circuit is operable to subtract the initial voltage reference signal and the amplitude noise compensation signal to produce the final voltage reference signal.

45. The apparatus of claim 43, wherein the amplitude response of the equalizer circuit is proportional to at least one magnitude within the frequency spectrum of the digital input signal.

46. A method of reducing errors in an analog output signal of a digital-to-analog converter, comprising:

receiving an initial word clock signal having timing information and timing noise;

receiving an initial voltage reference signal having amplitude information and amplitude noise; and modifying at least one of the initial word clock signal and the initial voltage reference signal to produce a final word clock signal and a final voltage reference signal, the final word clock signal and the final voltage reference signal being usable by the digital-to-analog converter such that errors in the analog output signal due to at least one of the timing noise on the initial word clock signal and the amplitude noise on the initial voltage reference signal are reduced.

47. The method of claim 46, wherein modifying the initial word clock signal includes at least partly canceling the timing noise from the initial word clock signal to produce the final word clock signal.

48. The method of claim 47, further comprising modulating a phase of the initial word clock signal in accordance with a modulating signal to produce the final word clock signal.

49. The method of claim 48, further comprising demodulating the phase of the initial word clock signal to produce a demodulated signal having an amplitude that is proportional to the timing noise.

50. The method of claim 49, further comprising equalizing the demodulated signal to produce the modulating signal.

51. The method of claim 50, wherein the step of modulating the phase of the initial word clock signal includes imposing a transfer function from the initial word clock signal to the final word clock signal such that timing noise on the final word clock signal as a function of frequency is proportional to a sum of (i) a product of the timing noise on the initial word clock signal and a first amplitude response of the transfer function imposed during the phase modulating step as functions of frequency, and (ii) a product of the modulating signal and a second amplitude response of the transfer function imposed during the phase modulating step as functions of frequency.

52. The method of claim 51, wherein the step of demodulating the phase of the initial word clock signal includes imposing a transfer function from the initial word clock signal to the demodulated signal such that the demodulated signal as a function of frequency is proportional to a product of the timing noise on the initial word clock signal and an amplitude response of the phase demodulator circuit as functions of frequency.

53. The method of claim 52, wherein the step of equalizing the demodulated signal includes imposing a transfer function from the demodulated signal to the modulating signal such that that timing noise on the final word clock signal as a function of frequency is substantially zero over at least some range of frequencies.

54. The method of claim 53, wherein the transfer function imposed during the equalizing step includes an amplitude response that is inversely proportional to an amplitude response of the transfer function imposed during the phase demodulating step.

55. The method of claim 54, wherein the transfer function imposed during the equalizing step includes a phase response as a function of frequency, the transfer function imposed during the phase demodulating step includes a phase response as a function of frequency, and the phase response of the transfer function imposed during the equalizing step is about 180 degrees shifted from the phase response of the transfer function imposed during the phase demodulating step.

56. The method of claim 54, wherein the amplitude response from the demodulated signal to the modulating signal imposed during the equalizing step is (i) inversely proportional to a product of the amplitude response of the transfer function imposed during the phase demodulating step and the second amplitude response of the transfer function imposed during the phase modulating step, and (ii) proportional to the first amplitude response of the transfer function imposed during the phase modulating step.

57. The method of claim 56, wherein the transfer function imposed during the equalizing step includes a phase response as a function of frequency, the transfer function imposed during the phase demodulating step includes a phase response as a function of frequency, the transfer function imposed during the phase modulating step includes a first phase response as a function of frequency from the initial word clock signal to the final word clock signal and a second phase response as a function of frequency from the modulating signal to the final word clock signal, and the phase response of the transfer function imposed during the equalizing step is about 180 degrees shifted from a difference of (i) the first phase response of the transfer function imposed during the phase modulating step, and (ii) a sum of the phase response of the transfer function imposed during the phase demodulating step and the second phase response of the transfer function imposed during the phase modulating step.

58. The method of claim 46, wherein modifying the initial voltage reference signal includes at least partly canceling the amplitude noise from the initial voltage reference signal to produce the final voltage reference signal.

59. The method of claim 58, wherein the step of modifying the initial voltage reference signal includes aggregating the initial voltage reference signal and an amplitude noise compensation signal to produce the final voltage reference signal.

60. The method of claim 59, wherein the step of modifying the initial voltage reference signal includes at least one of adding the initial voltage reference signal and the amplitude noise compensation signal, and subtracting the initial voltage reference signal and the amplitude noise compensation signal, to produce the final voltage reference signal.

61. The method of claim 60, further comprising equalizing the initial voltage reference signal to produce the amplitude noise compensation signal.

62. The method of claim 61, wherein
the aggregating step includes imposing a transfer function from the initial voltage reference signal to the final voltage reference signal such that the final voltage reference signal as a function of frequency is proportional to a sum of the initial voltage reference signal and the amplitude noise compensation signal as functions of frequency, and
the equalizing step includes imposing a transfer function from the initial voltage reference signal to the amplitude noise compensation signal that includes an amplitude response as a function of frequency such that amplitude noise on the final voltage reference signal as a function of frequency is substantially zero over at least some range of frequencies.

63. The method of claim 62, wherein the amplitude response from the initial voltage reference signal to the amplitude noise compensation signal imposed during the equalization step is substantially a constant over at least some range of frequencies.

64. The method of claim 63, wherein the constant is about unity.

65. The method of claim 63, wherein the amplitude response from the initial voltage reference signal to the amplitude noise compensation signal imposed during the equalization step is about zero at zero frequency.

66. The method of claim 62, wherein the transfer function from the initial voltage reference signal to the amplitude noise compensation signal imposed during the equalizing step includes a phase response that is about 180 degrees over at least the range of frequencies when the initial voltage reference signal is added to the amplitude noise compensation signal to produce the final voltage reference signal.

67. The method of claim 62, wherein the transfer function from the initial voltage reference signal to the amplitude noise compensation signal imposed during the equalizing step includes a phase response that is about zero degrees over at least the range of frequencies when the amplitude noise compensation signal is subtracted from the initial voltage reference signal to produce the final voltage reference signal.

68. The method of claim 62, wherein the transfer function imposed during the aggregating step is such that the final voltage reference signal as a function of frequency is proportional to a sum of (i) a product of the initial voltage reference signal and a first amplitude response as functions of frequency, and (ii) a product of the amplitude noise compensation signal and a second amplitude response as functions of frequency.

69. The method of claim 68, wherein the amplitude response of the transfer function imposed during the equalizing step is substantially proportional to a quotient of the first and second amplitude responses of the transfer function imposed during the aggregating step.

70. The method of claim 46, wherein modifying the initial word clock signal includes modifying the initial word clock signal as a function of the amplitude noise such that errors in the analog output signal due to the amplitude noise are reduced.

71. The method of claim 70, further comprising modulating a phase of the initial word clock signal in accordance with a modulating signal to produce the final word clock signal.

72. The method of claim 71, further comprising equalizing the initial voltage reference signal to produce the modulating signal.

73. The method of claim 72, wherein
the step of modulating the phase of the initial word clock signal includes imposing a first transfer function from the initial word clock signal to the final word clock signal such that timing noise on the final word clock signal as a function of frequency is proportional to a sum of the timing noise on the initial word clock signal and the modulating signal as functions of frequency,
the digital-to-analog converter has a first transfer function from the final word clock signal to the analog output signal as a function of frequency and a second transfer function from the final voltage reference signal to the analog output signal as a function of frequency, and
the step of equalizing the initial voltage reference signal includes imposing a transfer function from the initial voltage reference signal to the modulating signal as a function of frequency such that errors in the analog output signal due to the amplitude noise are reduced.

74. The method of claim 73, wherein the transfer function imposed during the equalizing step includes an amplitude response that is proportional to a quotient of second to first amplitude responses of the second and first transfer functions of the digital-to-analog converter, respectively.

75. The method of claim 74, wherein the transfer function imposed during the equalizing step includes a phase response as a function of frequency, the transfer function imposed during the phase modulating step includes a phase response as a function of frequency, and the phase response of the transfer function imposed during the equalizing step is about 180 degrees shifted from a difference of second and first phase responses of the second and first transfer functions of the digital-to-analog converter, respectively.

76. The method of claim 75, wherein the amplitude response imposed during the equalizing step is inversely proportional to an amplitude response of a second transfer function imposed during the phase modulating step from the modulating signal to the final word clock signal as a function of frequency.

77. The method of claim 76, wherein the phase response of the transfer function imposed during the equalizing step is about 180 degrees shifted from a difference of (i) the second phase response of the digital-to-analog converter, and (ii) a sum of the first phase response of the digital-to-analog converter and a phase response of the second transfer function imposed during the phase modulator step.

78. The method of claim 75, wherein the amplitude response of the transfer function imposed during the equalizer step is inversely proportional to a frequency spectrum of the digital input signal.

79. The method of claim 78, wherein the phase response of the transfer function imposed during the equalizer step is about 180 degrees shifted from a difference of (i) the second phase response of the digital-to-analog converter, and (ii) a sum of the first phase response of the digital-to-analog converter and a phase of the digital input signal as a function of frequency.

80. The method of claim 78, wherein the amplitude response of the transfer function imposed during the equalizer step is inversely proportional to at least one magnitude within the frequency spectrum of the digital input signal.

81. The method of claim 46, wherein modifying the initial voltage reference signal includes modifying the initial voltage reference signal as a function of the timing noise such that errors in the analog output signal due to the timing noise are reduced.

82. The method of claim 81, further comprising aggregating the initial voltage reference signal and an amplitude noise compensation signal to produce the final voltage reference signal.

83. The method of claim 82, wherein the aggregating step includes one of adding the initial voltage reference signal and the amplitude noise compensation signal, and subtracting the initial voltage reference signal and the amplitude noise compensation signal, to produce the final voltage reference signal.

84. The method of claim 83, further comprising demodulating a phase of the initial word clock signal to produce a demodulated signal having an amplitude that is proportional to the timing noise.

85. The method of claim 84, further comprising equalizing the demodulated signal to produce the amplitude noise compensation signal.

86. The method of claim 85, wherein
the step of demodulating the phase of the initial word clock signal includes imposing a transfer function from the initial word clock signal to the demodulated signal that includes an amplitude response and a phase response as functions of frequency such that the amplitude of the demodulated signal is proportional to the timing noise,
the digital-to-analog converter has a first transfer function from the final word clock signal to the analog output signal that includes a first amplitude response and a first phase response as functions of frequency and a second transfer function from the final voltage reference signal to the analog output signal that includes a second amplitude response and a second phase response as functions of frequency, and
the step of equalizing the demodulated signal includes imposing a transfer function from the demodulated signal to the amplitude noise compensation signal that includes an amplitude response and a phase response as functions of frequency such that errors in the analog output signal due to the timing noise are reduced.

87. The method of claim 86, wherein the amplitude response of the transfer function imposed during the equalizing step is (i) proportional to a quotient of the first to second amplitude responses of the first and second transfer functions of the digital-to-analog converter, respectively, and (ii) inversely proportional to the amplitude response of the transfer function imposed during the demodulating step.

88. The method of claim 87 wherein the phase response of the transfer function imposed during the equalizing step is one of:

about 180 degrees shifted from a difference of (i) the first phase response of the first transfer function of the digital-to-analog converter, and (ii) a sum of the second phase response of the second transfer function of the digital-to-analog converter and the phase response of the transfer function imposed during the demodulating step, when the summing step includes adding the initial voltage reference signal and the amplitude noise compensation signal to produce the final voltage reference signal, and about zero degrees shifted from a difference of (i) the first phase response of the first transfer function of the digital-to-analog converter, and (ii) a sum of the second phase response of the second transfer function of the digital-to-analog converter and the phase response of the transfer function imposed during the demodulating step, when the summing step includes subtracting the initial voltage reference signal and the amplitude noise compensation signal to produce the final voltage reference signal.

89. The method of claim 88, wherein the amplitude response of the transfer function imposed during the equalizing step is inversely proportional to an amplitude response of a transfer function imposed during the summing step from the amplitude noise compensation signal to the final voltage reference signal as a function of frequency.

90. The method of claim 89, wherein the phase response of the transfer function imposed during the equalizing step is one of:

about 180 degrees shifted from a difference of (i) the first phase response of the first transfer function of the digital-to-analog converter, and (ii) a sum of the second phase response of the second transfer function of the digital-to-analog converter, the phase response of the transfer function imposed during the demodulating step, and a phase response of the transfer function imposed during the summing step, when the summing step includes adding the initial voltage reference signal and the amplitude noise compensation signal to produce the final voltage reference signal, and about zero degrees shifted from a difference of (i) the first phase response of the first transfer function of the digital-to-analog converter, and (ii) a sum of the second phase response of the second transfer function of the digital-to-analog converter, the phase response of the transfer function imposed during the demodulating step, and a phase response of the transfer function imposed during the summing step, when the summing step includes subtracting the initial voltage reference signal and the amplitude noise compensation signal to produce the final voltage reference signal.

91. The method of claim 89, wherein the amplitude response of the transfer function imposed during the equalizing step is proportional to a frequency spectrum of the digital input signal.

92. The method of claim 91, wherein the phase response of the transfer function imposed during the equalizing step is one of:

about 180 degrees shifted from a difference of (i) a sum of the first phase response of the first transfer function of the digital-to-analog converter and a phase of the digital input signal as a function of frequency, and (ii) a sum of the second phase response of the second transfer function of the digital-to-analog converter and the phase response of the transfer function imposed during the demodulating step, when the summing step includes adding the initial voltage reference signal and the amplitude noise compensation signal to produce the final voltage reference signal, and about zero degrees shifted from a difference of (i) a sum of the first phase response of the first transfer function of the digital-to-analog converter and a phase of the digital input signal as a function of frequency, and (ii) a sum of the second phase response of the second transfer function of the digital-to-analog converter and the phase response of the transfer function imposed during the demodulating step, when the summing step includes subtracting the initial voltage reference signal and the amplitude noise compensation signal to produce the final voltage reference signal.

93. The method of claim 91, wherein the amplitude response of the transfer function imposed during the equalizing step is proportional to at least one magnitude within the frequency spectrum of the digital input signal.

\* \* \* \* \*